(12) United States Patent
Fukuda

(10) Patent No.: US 9,000,535 B2
(45) Date of Patent: Apr. 7, 2015

(54) SEMICONDUCTOR DEVICE AND SEMICONDUCTOR DEVICE MANUFACTURING METHOD

(75) Inventor: Masatoshi Fukuda, Akiruno (JP)

(73) Assignee: Fujitsu Semiconductor Limited, Yokohama (JP)

(*) Notice: Subject to any disclaimer, the term of this patent is extended or adjusted under 35 U.S.C. 154(b) by 35 days.

(21) Appl. No.: 13/587,999

(22) Filed: Aug. 17, 2012

(65) Prior Publication Data

US 2013/0082331 A1   Apr. 4, 2013

(30) Foreign Application Priority Data

Oct. 4, 2011   (JP) .................. 2011-220009

(51) Int. Cl.
H01L 27/11 (2006.01)
H01L 27/088 (2006.01)
H01L 21/8234 (2006.01)
H01L 27/02 (2006.01)
H01L 21/768 (2006.01)
H01L 29/78 (2006.01)

(52) U.S. Cl.
CPC ...... *H01L 27/088* (2013.01); *H01L 21/823475* (2013.01); *H01L 27/0207* (2013.01); *H01L 21/76895* (2013.01); *H01L 21/76807* (2013.01); *H01L 21/76816* (2013.01); *H01L 27/1104* (2013.01); *H01L 27/1116* (2013.01); *H01L 29/7833* (2013.01)

(58) Field of Classification Search
USPC ............... 257/368, E27.06; 438/197, 687
See application file for complete search history.

(56) References Cited

U.S. PATENT DOCUMENTS

| 5,112,765 A | 5/1992 | Cederbaum et al. |
| 6,326,306 B1* | 12/2001 | Lin ............... 438/687 |
| 6,479,873 B1* | 11/2002 | Yoshiyama et al. ......... 257/382 |
| 7,786,529 B2* | 8/2010 | Kim ............... 257/330 |
| 2003/0199169 A1 | 10/2003 | Jun et al. |
| 2009/0014796 A1* | 1/2009 | Liaw ............... 257/347 |

FOREIGN PATENT DOCUMENTS

| JP | 6-13576 | 1/1994 |
| JP | 2003-318258 | 11/2003 |

OTHER PUBLICATIONS

JPOA—Japanese Office Action (Notice of Reasons of Rejection) dated Dec. 9, 2014, issued in corresponding Japanese Patent Application No. 2011-220009, with Partial English translation.

* cited by examiner

*Primary Examiner* — Cheung Lee
*Assistant Examiner* — Stephen Bradley
(74) *Attorney, Agent, or Firm* — Fujitsu Patent Center

(57) ABSTRACT

A semiconductor device includes: a semiconductor substrate; a first transistor which is formed on the semiconductor substrate and includes a source/drain region and a gate electrode; an insulating film which covers the source/drain region and the gate electrode of the first transistor; and a first contact plug which is formed in the insulating film and is connected to the source/drain region or the gate electrode of the first transistor, wherein the first contact plug includes a first column section which extends in a thickness direction of the insulating film and is in contact with the source/drain region or the gate electrode of the first transistor, and a first flange section which juts out from an upper portion of the first column section in a direction parallel to a surface of the insulating film, and an upper surface of the first flange section is planarized.

8 Claims, 32 Drawing Sheets

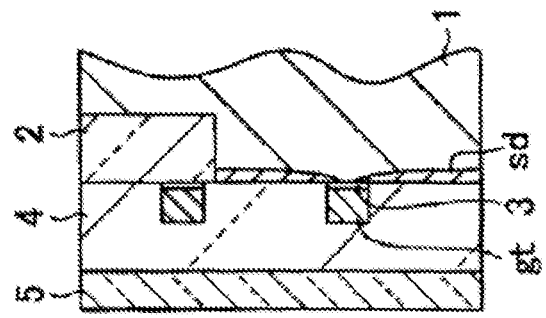
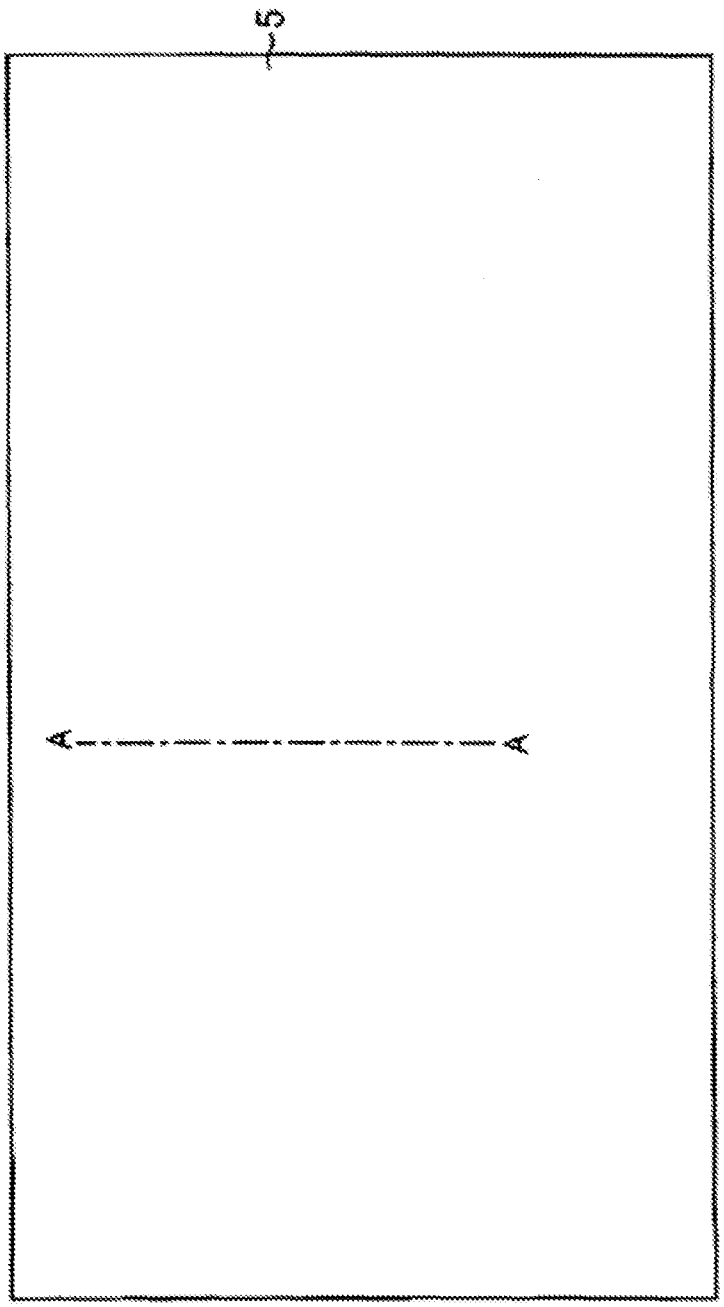

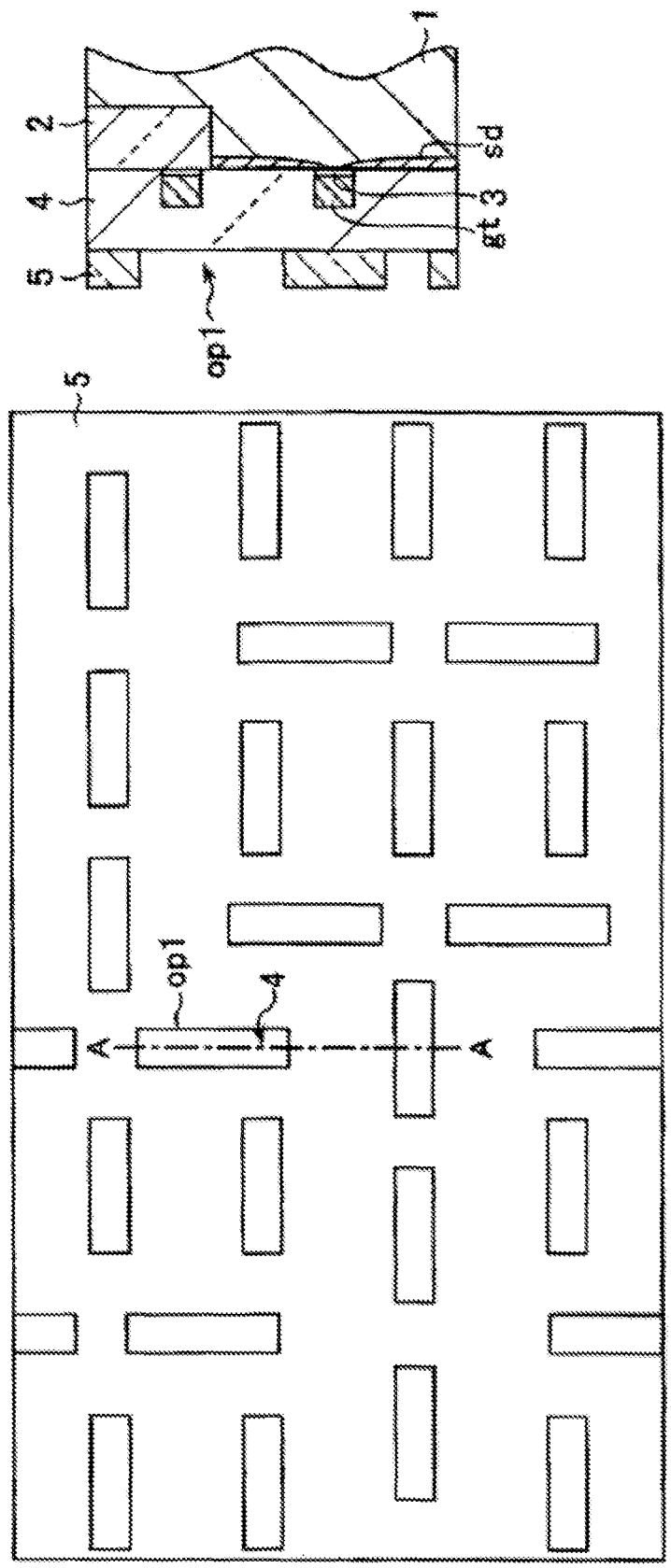

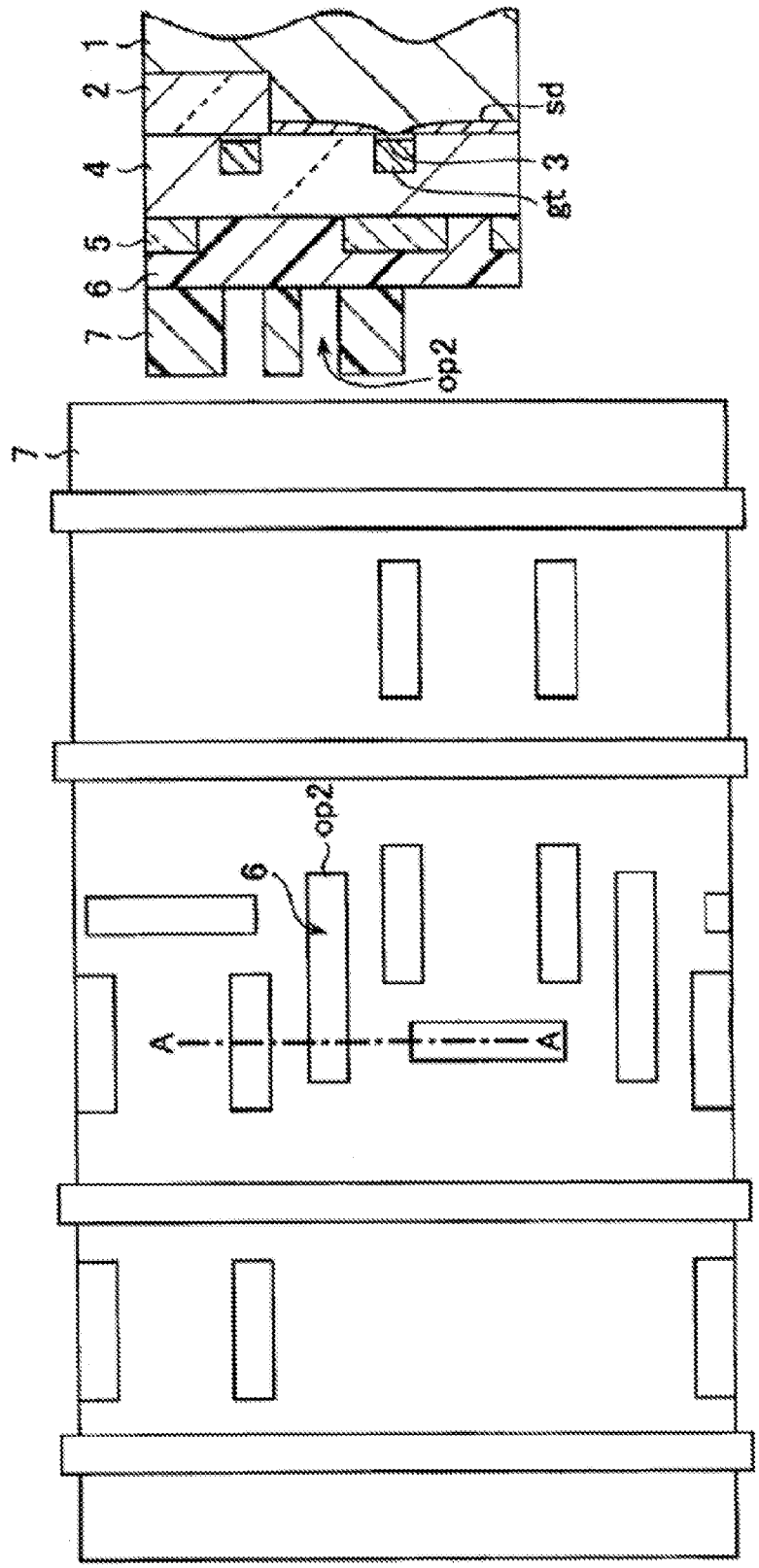

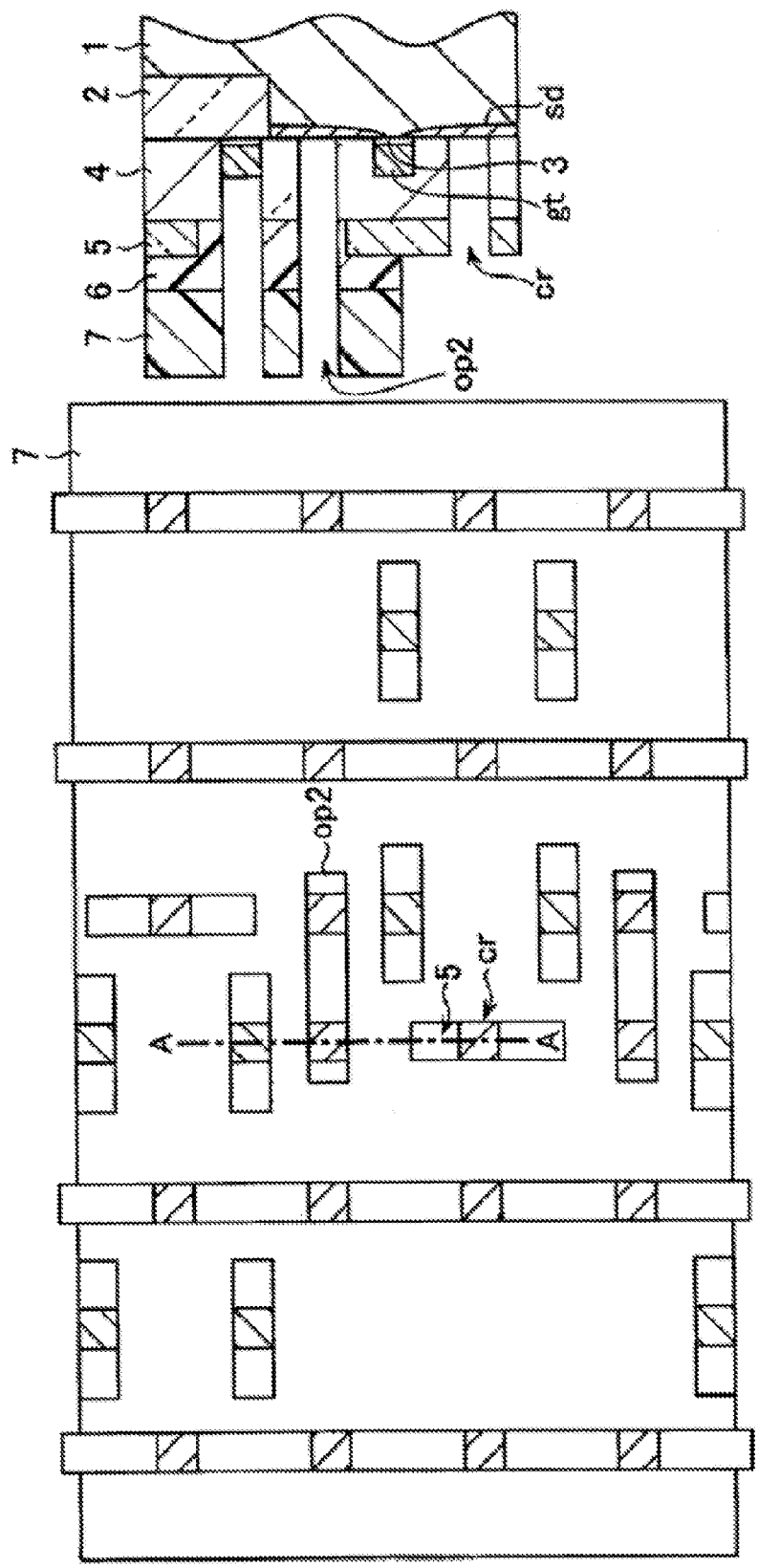

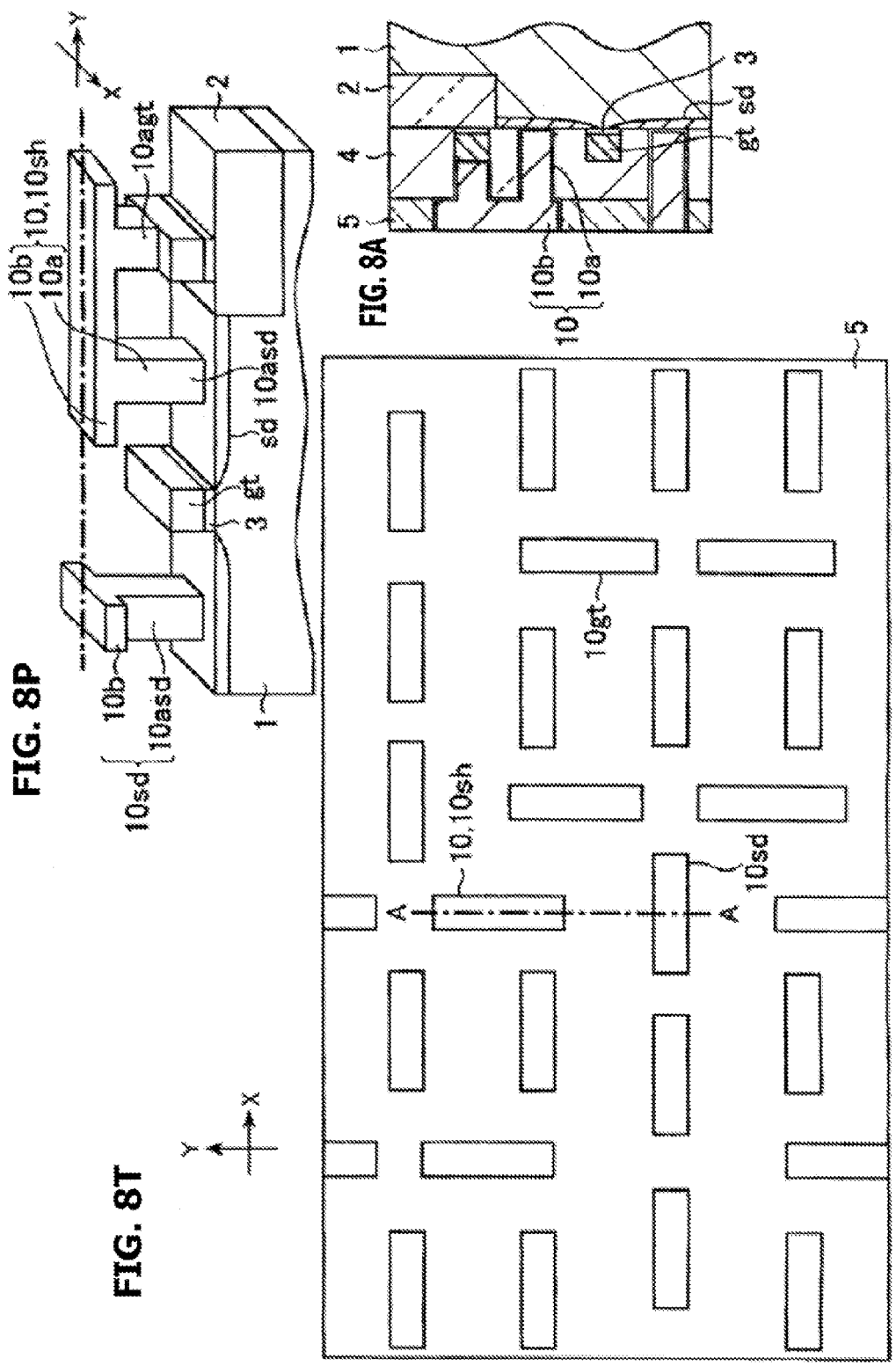

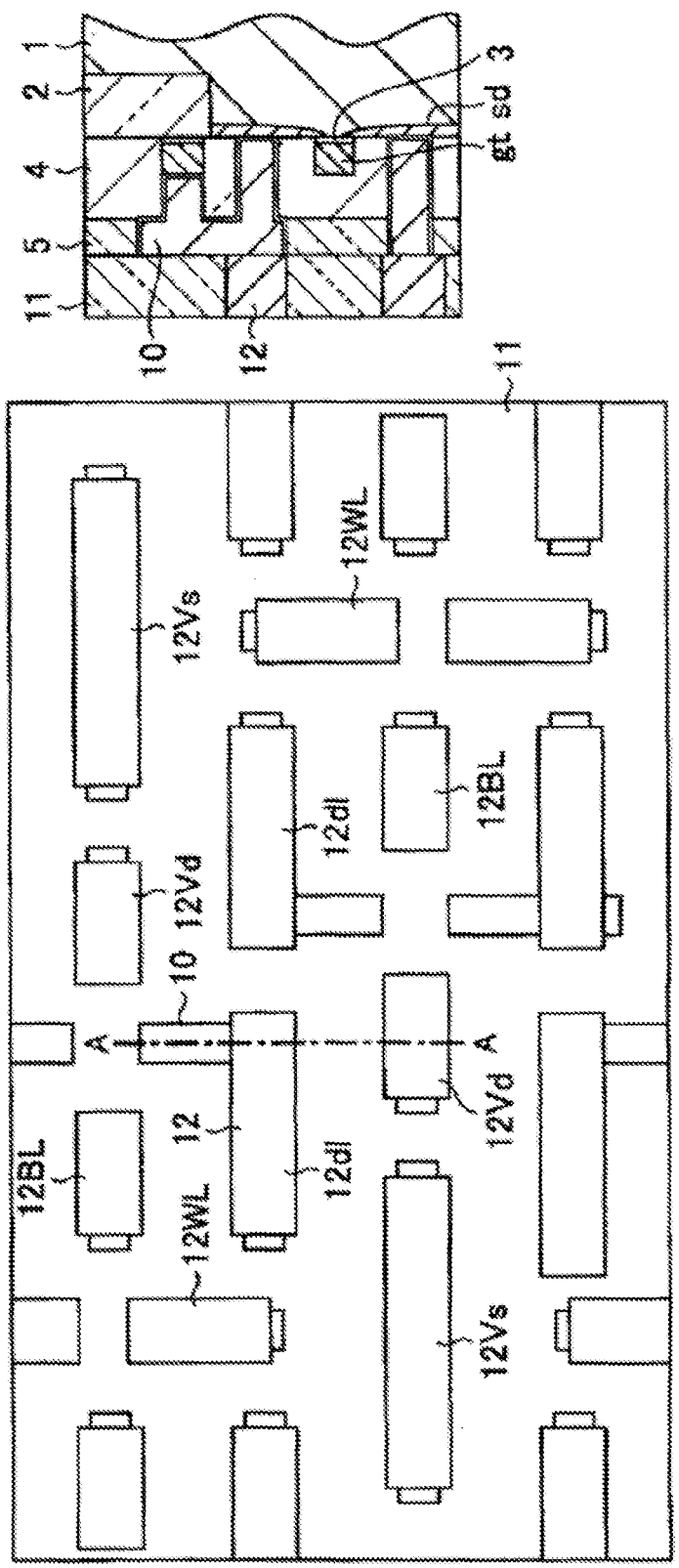

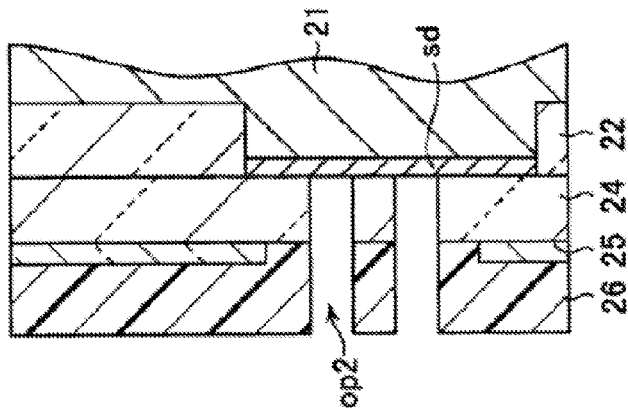
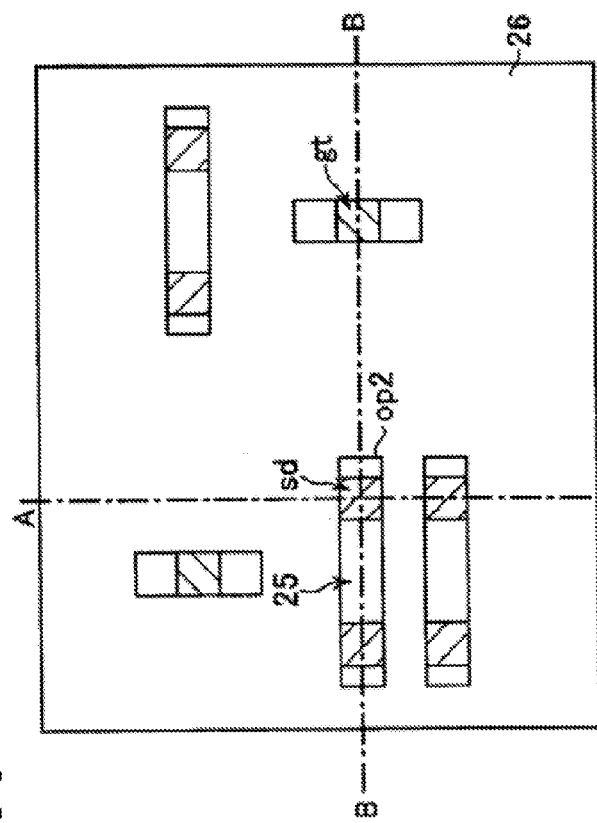
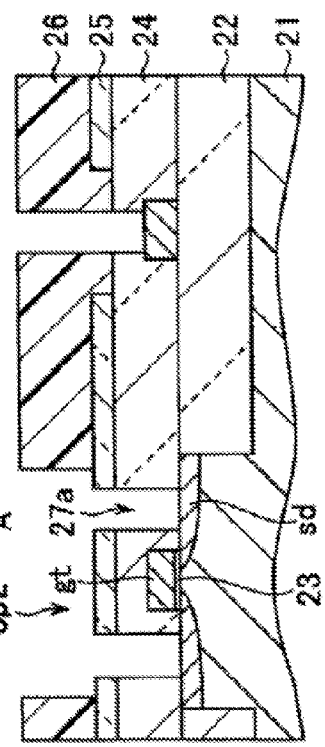

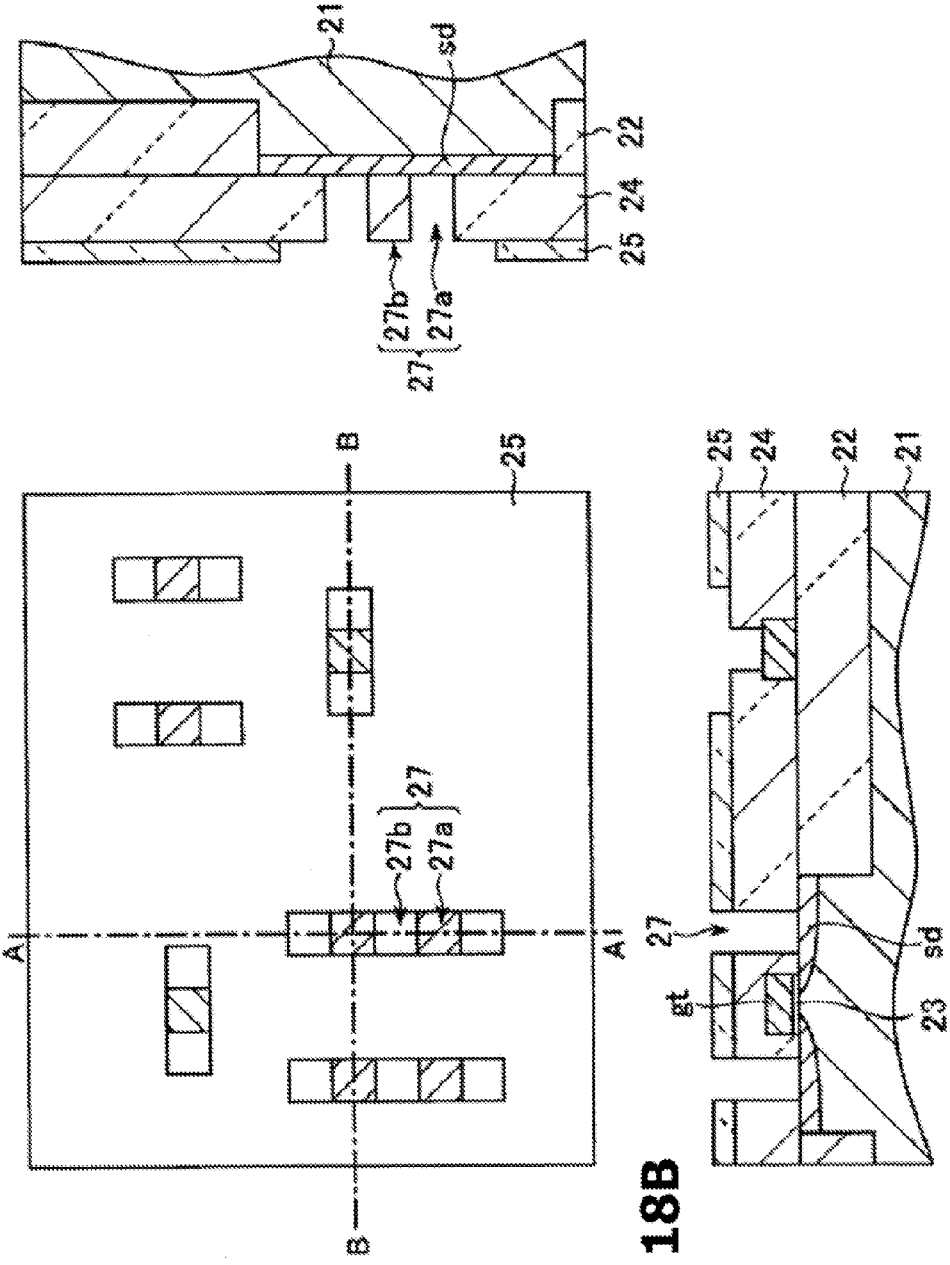

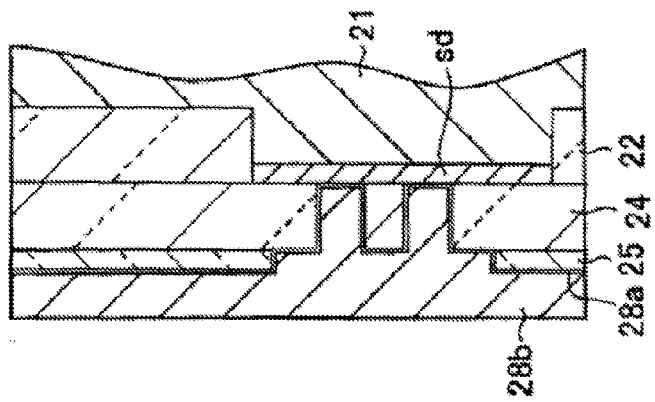
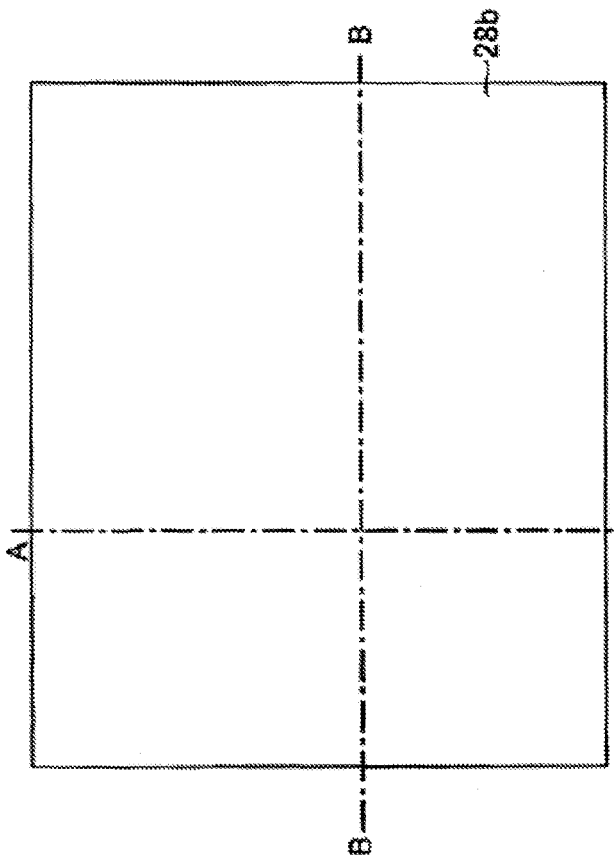
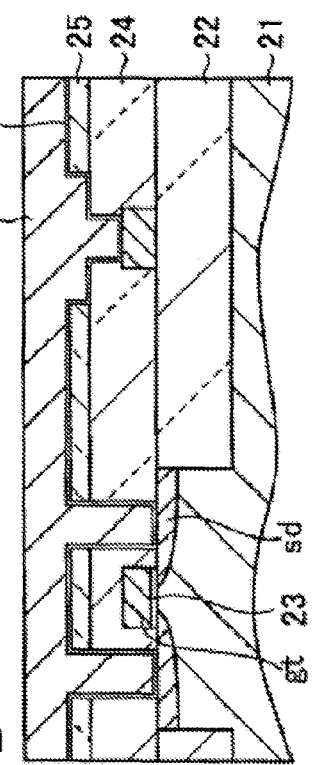

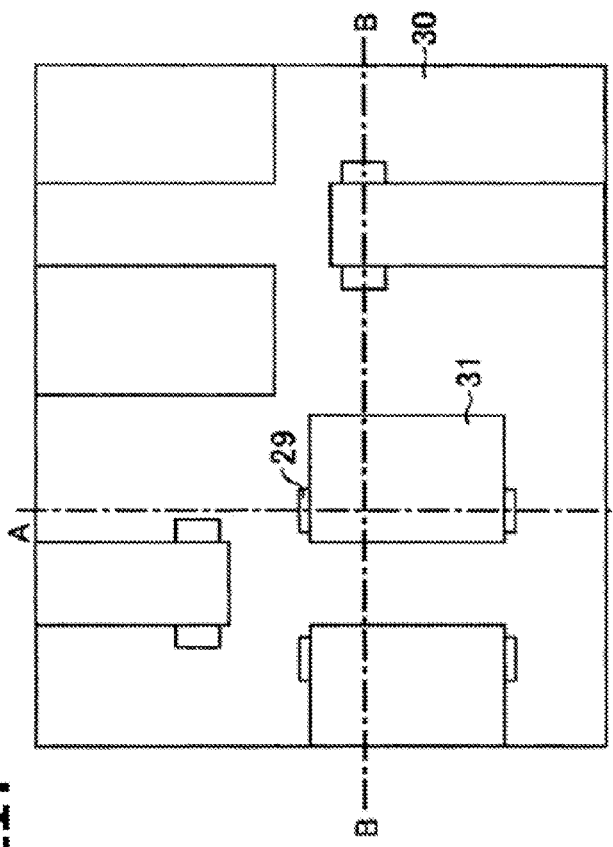
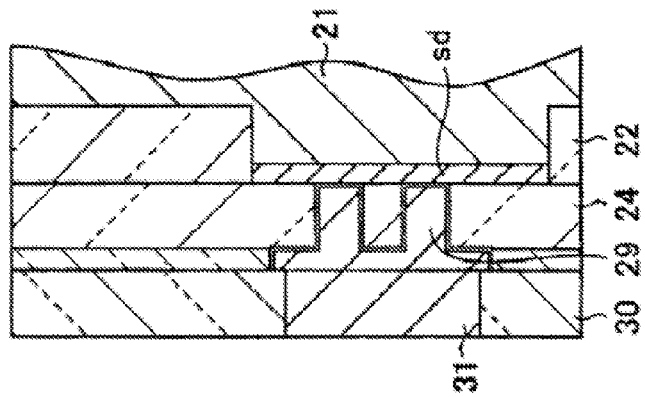
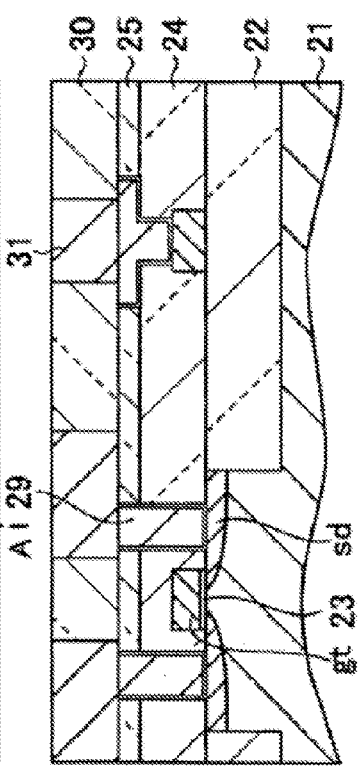
FIG. 21T
FIG. 21A
FIG. 21B

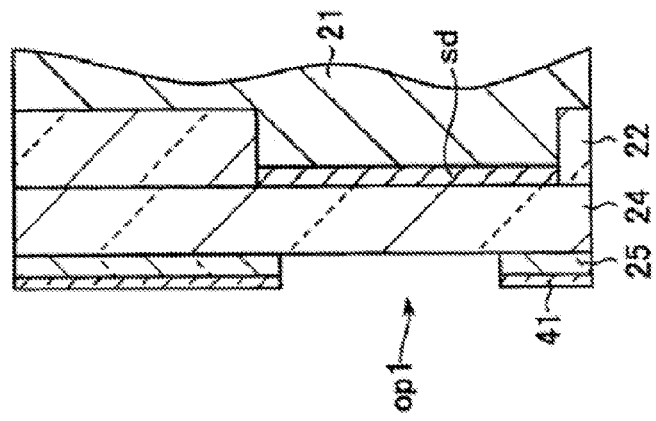
FIG. 24A
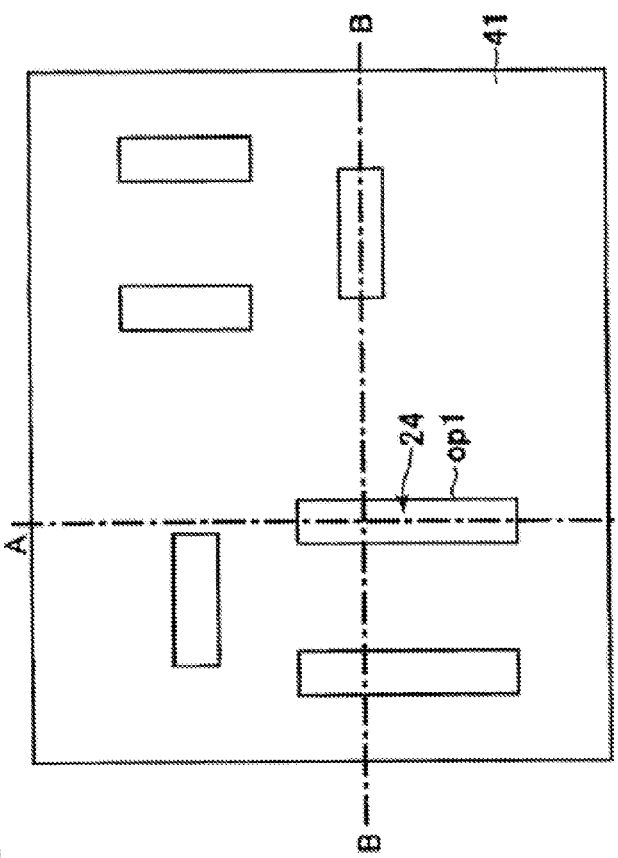
FIG. 24T
FIG. 24B
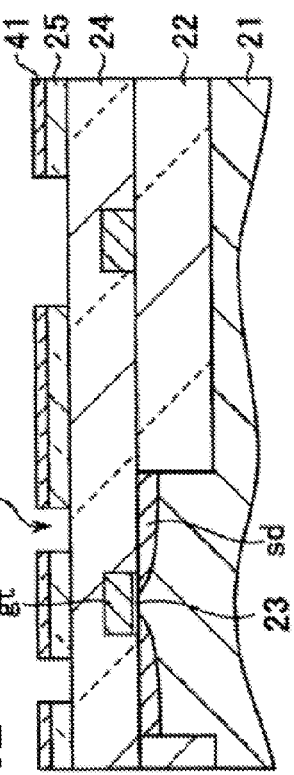

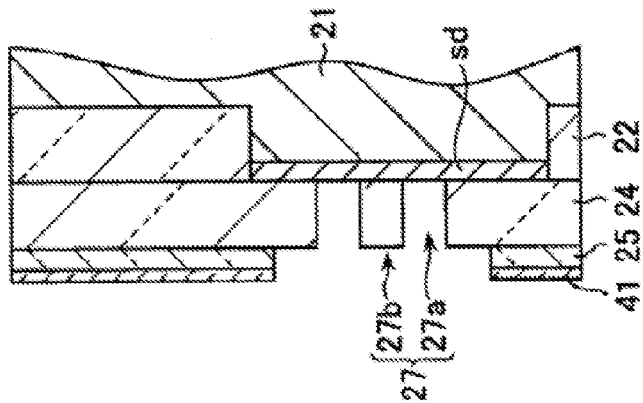
FIG. 27A
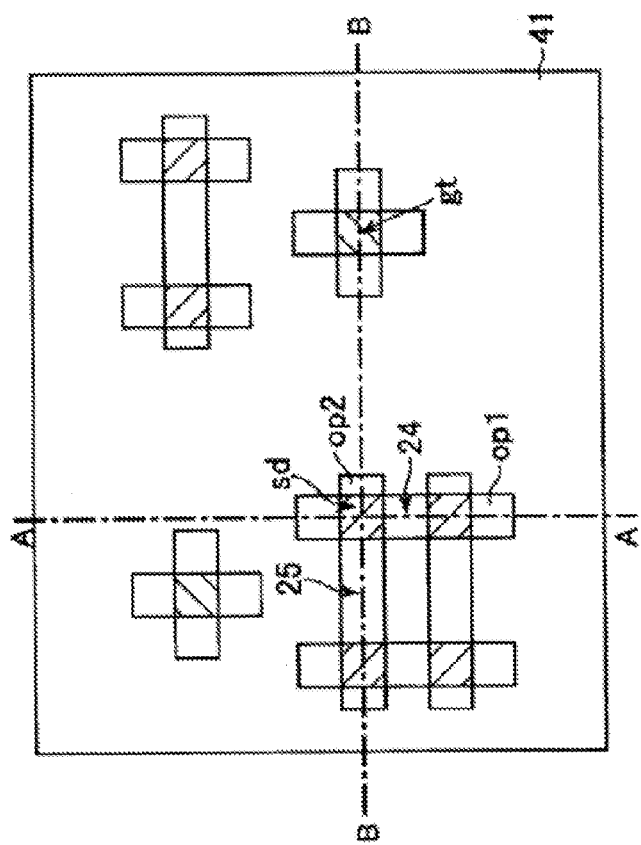
FIG. 27T
FIG. 27B

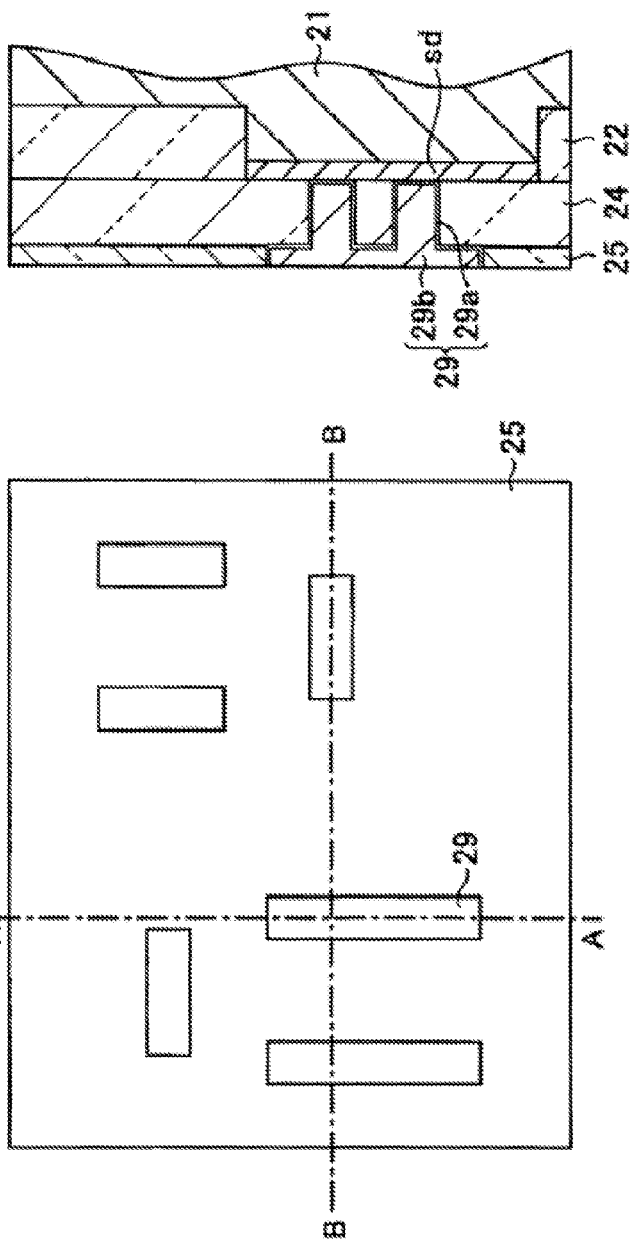

SEMICONDUCTOR DEVICE AND SEMICONDUCTOR DEVICE MANUFACTURING METHOD

CROSS-REFERENCE TO RELATED APPLICATION

This application is based upon and claims the benefit of priority of the prior Japanese Patent Application No. 2011-220009, filed on Oct. 4, 2011, the entire contents of which are incorporated herein by reference.

FIELD

The embodiments discussed herein are related to a semiconductor device and a semiconductor device manufacturing method

BACKGROUND

Demands for the miniaturization of semiconductor integrated circuits continue to persist, and technical development for reducing the sizes of static random access memories (SRAMs) and logic circuits continues to be carried out. In the present situation, various companies are promoting the development of products with M1 half pitches of 45 nm or less according to their road maps.

In recent years, lax limits on the improvement in exposure devices have become visible. In addition, restraint of variation in device characteristics and improvement in yields associated with miniaturization are mentioned as future tasks.

In order to reduce the physical sizes of circuits to meet the recent demand for miniaturization, there has been increasing importance of not only downsizing lithography patterns but also exercising ingenuity aiming to develop new methods of disposing elements and connecting wiring.

For example, a technique that uses two types of contact plugs of an ordinary contact plug and a shared contact plug has been proposed to connect a transistor forming an SRAM to an upper wiring layer (see Japanese Patent No. 3064999 and Japanese Patent No. 4618914, for example). A shared contact plug can contribute to reducing the area of an SRAM by connecting both a transistor gate electrode and a source/drain region by means of a single contact hole pattern.

On the other hand, improvement in the accuracy of lithographic patterning by variation control is now achieved by forming an SRAM consisting of gate electrodes and active regions both of which have relatively simple line-and-space shapes (see Japanese Patent No. 4618914, for example). It has become increasingly important to exercise ingenuity in pattern shapes for overcoming the limits of lithography.

By way of a method of forming holes, a technique is proposed that uses a two-layer mask pattern and forms holes in portions where openings of these mask patterns overlap each other (see Japanese Unexamined Patent Publication (Kokai) No. SHO 51-051283, Japanese Unexamined Patent Publication (Kokai) No. 2008-211027, Japanese Unexamined Patent Publication (Kokai) No. 2005-159264, and Japanese Unexamined Patent Publication (Kokai) No. 2006-156422, for example).

SUMMARY

According to one aspect of the present invention, a semiconductor device includes: a semiconductor substrate; a first transistor which is formed on the semiconductor substrate and includes a source/drain region and a gate electrode; an insulating film which covers the source/drain region and the gate electrode of the first transistor; and a first contact plug which is formed in the insulating film and is connected to the source/drain region or the gate electrode of the first transistor, wherein the first contact plug includes a first column section which extends in a thickness direction of the insulating film and is in contact with the source/drain region or the gate electrode of the first transistor, and a first flange section which juts out from an upper portion of the first column section in a direction parallel to a surface of the insulating film, and an upper surface of the first flange section is planarized.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1T to FIG. 7T and FIG. 1A to FIG. 7A are schematic plan views and schematic cross-sectional views, respectively, which illustrate main steps of a method of manufacturing a semiconductor device based on Embodiment 1.

FIG. 8T and FIG. 8A, and FIG. 8P are a schematic plan view, a schematic cross-sectional view, and a schematic perspective view, respectively, which illustrate main steps of the method of manufacturing the semiconductor device based on Embodiment 1.

FIG. 9T and FIG. 9A are a schematic plan view and a schematic cross-sectional view, respectively, which illustrate main steps of the method of manufacturing the semiconductor device based on Embodiment 1.

FIG. 13T to FIG. 21T are schematic plan views which illustrate main steps of a method of manufacturing a semiconductor device based on Embodiment 2.

FIG. 13A to FIG. 21A and FIG. 13B to FIG. 21B are schematic cross-sectional views which illustrate main steps of the method of manufacturing the semiconductor device based on Embodiment 2.

FIG. 23T to FIG. 30T are schematic plan views which illustrate main steps of a method of manufacturing a semiconductor device based on Embodiment 3.

FIG. 23A to FIG. 30A and FIG. 23B to FIG. 30B are schematic cross-sectional views which illustrate main steps of the method of manufacturing the semiconductor device based on Embodiment 3.

DESCRIPTION OF EMBODIMENTS

In the first place, an explanation will be made of a method of manufacturing a semiconductor device based on Embodiment 1. In Embodiment 1, a static random access memory (SRAM) is formed.

FIG. 1T to FIG. 9T, and FIG. 1A to FIG. 9A are schematic plan views and schematic cross-sectional views, respectively, which illustrate the method of manufacturing the semiconductor device based on Embodiment 1. The symbol "T" is assigned to plan views. The symbol "A" is assigned to cross-sectional views along dashed-dotted lines AA. FIG. 8P is a schematic plan perspective view which corresponds the cross-sectional view along dashed-dotted line AA.

Figure 1A:
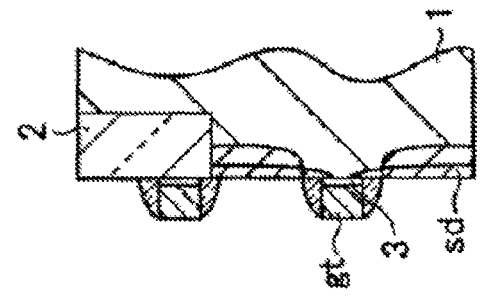
Figure 1T:
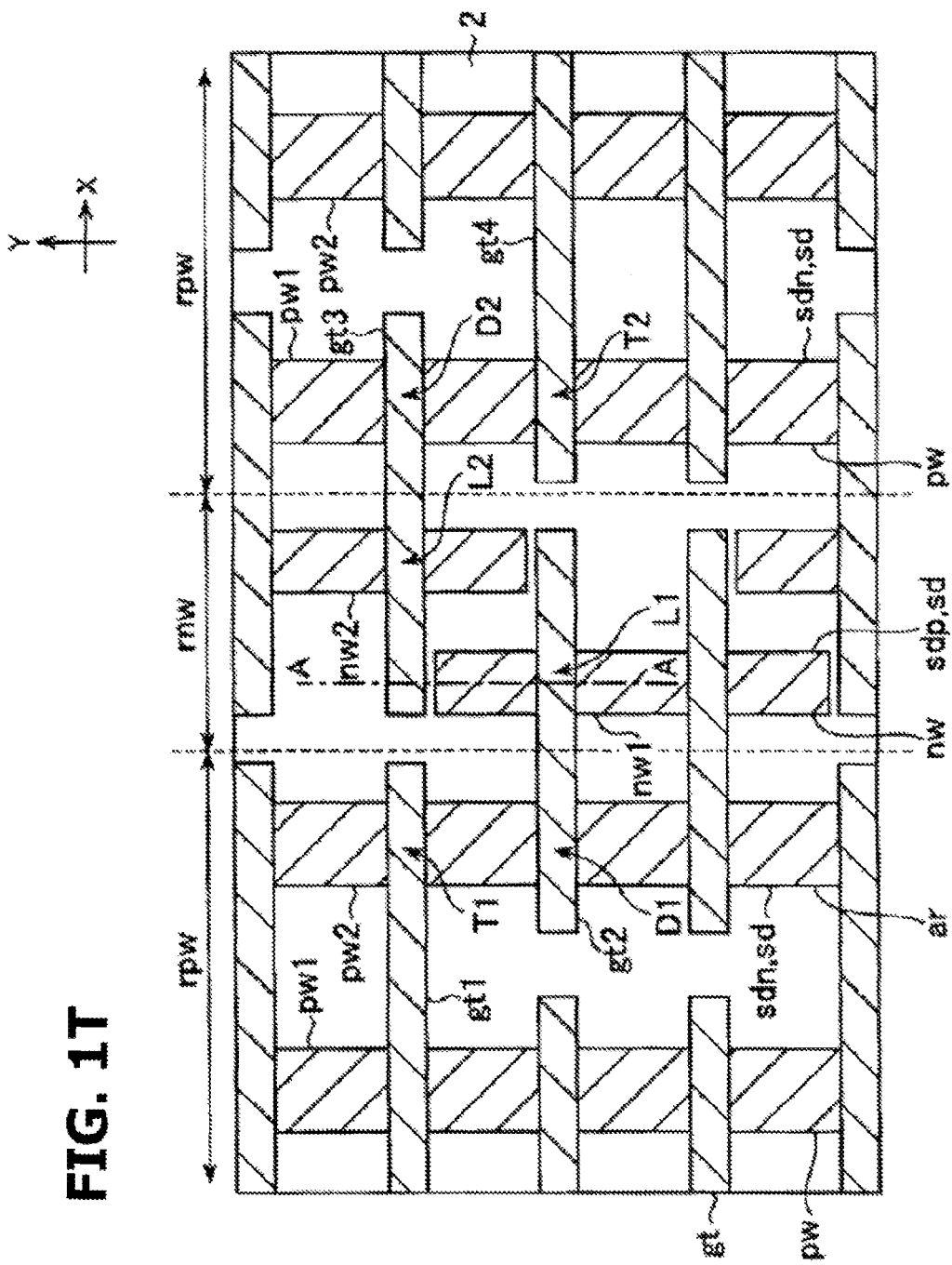

In plan views such as FIG. 1T, the lateral direction on the plane of paper is called the X-direction, and the vertical direction on the plane of paper is called the Y-direction. Plan views such as FIG. 1T illustrate the vicinity of six MOS transistors which form a single SRAM.

Reference will be made to FIG. 1T and FIG. 1A. An element separating insulating film 2 is formed on a semiconductor substrate (such as a silicon substrate), for example, by means of shallow trench isolation (STI), thereby demarcating active regions ar. Regions rpw where p-type wells are formed, that is, regions where n-type MOS transistors are formed, and regions mw where n-type wells are formed, that is, regions p-type MOS transistors are formed, are alternately disposed in the X-direction.

P-type impurity is injected into the n-type MOS transistor forming regions rpw, thereby forming p-type wells pw. N-type impurity is injected into the p-type MOS transistor forming regions mw, thereby forming n-type wells pw.

In the n-type MOS transistor forming regions rpw, intra-p-type-well active regions pw1 and pw2 are formed into a shape which extends in the Y-direction, and are disposed side by side in the X-direction. The width (dimension in the X-direction) of an active region pw1 and that of an active region pw2 are each 80 nm, for example.

In the p-type MOS transistor forming regions mw, intra-n-type-well active regions nw1 and nw2 are formed into a shape which extends in the Y-direction, and are disposed side by side in the X-direction. An active region nw1 in a first column and an active region nw2 in a second column are alternately disposed in such a way that their ends partially overlap each other in the Y-direction. The width (X-wise dimension) of an active region nw1 and that of an active region nw2 are each 50 nm, for example.

A conductive film formed of poly-silicon, for example, is deposited on the silicon substrate 1 so that, a gate insulating film 3 formed of silicon oxide, for example, is interposed in between. The conductive film is patterned, thereby forming gate electrodes gt. Gate electrodes gt are all formed into a shape which extends in the X-direction. Rows that are formed so that the gate electrodes gt are disposed side by side in the X-direction, are disposed side by side in the Y-direction. The gate length (Y-wise dimension) of each gate electrode gt is 30 nm, for example. In the plan view 1T, gate electrodes gt are illustrated by hatching with lines rising from left to right.

In the n-type MOS transistor forming regions rpw, gate electrodes gt are used as mask to inject n-type impurity into p-type wells pw to form low-concentration n-type source/drain regions sdn. In p-type MOS transistor forming regions rnw, gate electrodes gt are used as mask to inject p-type impurity into n-type wells nw to form low-concentration p-type source/drain regions sdp. In the plan view 1T, low-concentration source/drain regions sdn and sdp (source/drain regions sd) are illustrated by hatching with lines rising from right to left.

Subsequently, for example, SiN film, or SiO$_2$ film, or laminated film consisting of SiN film and SiO$_2$ film is deposited on the silicon substrate 1 so that gate electrodes gt are covered. Anisotropic etching is performed on this film, thereby forming sidewall spacer insulating films on the side surfaces of gate electrodes gt. Then in n-type MOS transistor forming regions rpw, by using gate electrodes gt and sidewall spacer insulating films as mask, n-type impurity is injected, thereby forming high-concentration n-type source/drain regions. In p-type MOS transistor forming regions mw, by using gate electrodes gt and sidewall spacer insulating films as mask, p-type impurity is injected, thereby forming high-concentration p-type source/drain regions.

The cross-sectional view 1A illustrates a sidewall spacer insulating film and a high-concentration source/drain region.

Furthermore, source/drain regions and the upper surfaces of gate electrodes are silicidized. For example, MOS transistors are formed in this way.

Moreover, transistor forming methods are not limited to the above-mentioned example. It is sufficient if gate electrodes are formed with gate insulating films interposed in contact therewith. Gate insulating films are not limited to SiO$_2$ films. High-k films can also be used. The whole, or at least the surfaces, of gate electrodes can be formed of a low-resistance material such as metal, silicide, or alloy. The surfaces of source/drain impurity diffusion layers are formed of a low-resistance material such as silicide, metal, or alloy. Furthermore, SiGe etc. can also be used. The source/drain impurity diffusion layers are separated from the gate electrodes by gate insulating films and by insulating material articles such as sidewall-like spacers.

Transistors may be of the planar type, multi-gate type, or other appropriate types. In this regard, it is preferable that the transistors are so structured that gate electrodes and source/drains are exposed, as seen from the directions of the surfaces. It is possible to change, as appropriate, the widths, the lengths, and the numbers of the gate electrodes and the source drain electrodes. The materials for the electrodes and the insulating films can be changed so as to be compatible with intended uses.

In an n-type MOS transistor forming region rpw which is disposed to the left of a p type MOS transistor forming region mw, an n-type MOS transistor T1, which constitutes one of the transfer transistors for an SRAM, is formed at the intersection of a gate electrode gt1 and an active region pw2. Furthermore, an n-type MOS transistor D1, which constitutes one of the driver transistors for the SRAM, is formed at the intersection of a gate electrode gt2 and the active region pw2.

In a p-type MOS transistor forming region rnw, a p-type MOS transistor L1, which constitutes one of the load transistors for the SRAM, is formed at the intersection of a gate electrode gt2 and an active region nw1. Furthermore, an n-type MOS transistor L2, which constitutes the other load transistor, is formed at the intersection of a gate electrode gt3 and the active region nw2.

In an n-type MOS transistor forming region rpw which is disposed to the right of a p type MOS transistor forming region mw, an n-type MOS transistor D2, which constitutes the other driver transistor, is formed at the intersection of a gate electrode gt3 and an active region pw1. Furthermore, an n-type MOS transistor T2, which constitutes the other transfer transistor, is formed at the intersection of a gate electrode gt4 and an active region pw1.

The gate electrode gt1 and the gate electrode gt3 are disposed so as to be arranged side by side in the X-direction. The gate electrode gt2 and the gate electrode gt4 are disposed so as to be arranged side by side in the X-direction. The row in which the gate electrode gt1 and the gate electrode gt3 are disposed and the row in which the gate electrode gt2 and the gate electrode gt4 are disposed, are adjacent to each other in the Y-direction. The gate electrodes gt which are disposed in the row where the gate electrode gt1 and the gate electrode gt3 are disposed, and the gate electrodes gt which are disposed in the row where the gate electrode gt2 and the gate electrode gt4 are disposed, are alternately disposed in the X-direction so that the ends of gate electrodes partially overlap each other.

The gate electrode gt2 intersects the active region nw1 but does not intersect the active region nw2. The gate electrode gt3 intersects the active region nw2 but does not intersect the active region nw1.

The MOS transistors T1, D1, L1, L2, D2, and T2 form a single SRAM. Matters related to the connection among these transistors will be explained later.

Reference is made to FIG. 2T and FIG. 2A. For example, silicon oxide ($SiO_2$) is deposited on a silicon substrate 1 to a depth of approximately 150 nm (±50 nm or so) by means of chemical vapor deposition (CVD) so that the MOS transistors T1 etc. are covered, thereby forming an interlayer insulating film 4. The surface of the interlayer insulating film 4 is planarized by means of chemical mechanical polishing (CMP). For example, silicon nitride (SiN) is deposited on the interlayer insulating film 4 to a depth of approximately 30 nm (±20 nm or so) by means of CVD, thereby forming a hard mask film 5.

In this regard, another material such as tetraethoxysilane (TEOS), undoped silicate glass (USG), boron phosphorus silicate glass (BPSG), SiOC, or a porous low dielectric material can be used as the material for the interlayer insulating film 4. Furthermore, as for the material for the hard mask 5, it is possible to use another material such as SiON, SiCN, $SiO_2$, USG, or TEOS. Here, it is preferable that the material for the interlayer insulating film 4 and the material for the hard mask film 5 constitute a combination such that these materials can be etched at different etching rates (can be etched on a mutually selective basis).

Furthermore, a compressive or tensile contact etch stop layer (CESL) may be provided under the interlayer insulating film 4 so that gate electrodes and source/drain regions are covered. The contact etch stop layer is formed of an SiN film, for example.

Reference is made to FIG. 3T and FIG. 3A. A reflection preventing film is formed on the hard mask film 5. Photoresist is applied to the reflection preventing film. A resist pattern in which openings are formed in a first pattern for forming contact holes, is formed by means of photolithography.

By using this resist pattern as mask, the reflection preventing film and the hard mask film 5 are etched by reactive ion etching (RIE). This treatment is called the first etching. As for the first etching, it is preferable to use a gas which is capable of selectively etching the hard mask film 5 with respect to the interlayer insulating film 4. For example, it is possible to use a gas mixture which contains $CF_4$ and is diluted with oxygen, the constituent gases being mixed at ratios permitting selective etching of silicon nitride. It is also possible to use another gas such as $C_4F_8$, $CH_2F_2$, $CHF_3$, or $CH_3F$. Subsequently, the resist pattern and the reflection preventing film are removed.

The hard mask 5, in which the openings op1 are formed in the first pattern, is formed by means of the first etching. The interlayer insulating film 4 is exposed at the bottom of the openings op1. Each of the openings op1 disposed in the first patterns 1, has a rectangular shape which is long in the longitudinal direction (X-direction) of a gate electrode gt, or has a rectangular shape which is long in the direction (Y-direction) that perpendicularly intersects the longitudinal direction the gate electrode gt.

Reference is made to FIG. 4T and FIG. 4A. A reflection preventing film 6 is formed on the hard mask 5. Photoresist is applied to the reflection preventing film 6. A resist pattern 7 in which openings op2 are formed in a second pattern for forming contact holes, is formed by means of photolithography. Each of the openings op2 disposed in the second patterns 2, has a rectangular shape which is long in the longitudinal direction (X-direction) of a gate electrode gt, or has a rectangular shape which is long in the direction (Y-direction) that perpendicularly intersects the longitudinal direction the gate electrode gt.

Reference is made to FIG. 5T and FIG. 5A. By using the resist pattern 7 as mask, the reflection preventing film 6 and the interlayer insulating film 4 are etched by RIE. This treatment is called the second etching. As for the second etching, it is preferable to use a gas which is capable of selectively etching the interlayer insulating film 4 with respect to the hard mask 5. For example, it is possible to use a gas mixture which contains $CF_4$ and is diluted with Ar, the constituent gases being mixed at ratios permitting selective etching of silicon nitride. It is also possible to use another gas such as $C_4F_8$, $CH_2F_2$, $CHF_3$, or $CH_3F$.

Due to such selective etching, subsequent to the removal of the reflection preventing film 6, those portions of the hard mask 5 which are exposed to the inside of openings op2 in the resist pattern 7 also serve as mask for the second etching. Through the second etching, the interlayer insulating film 4 is removed only at intersections cr where the openings op2 in the second pattern and the openings op1 in the first pattern mutually overlap.

Figure 6A:
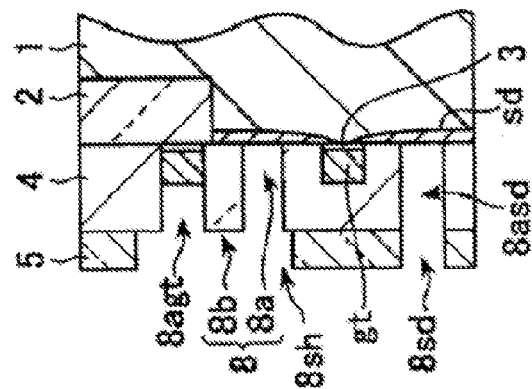
Figure 6T:
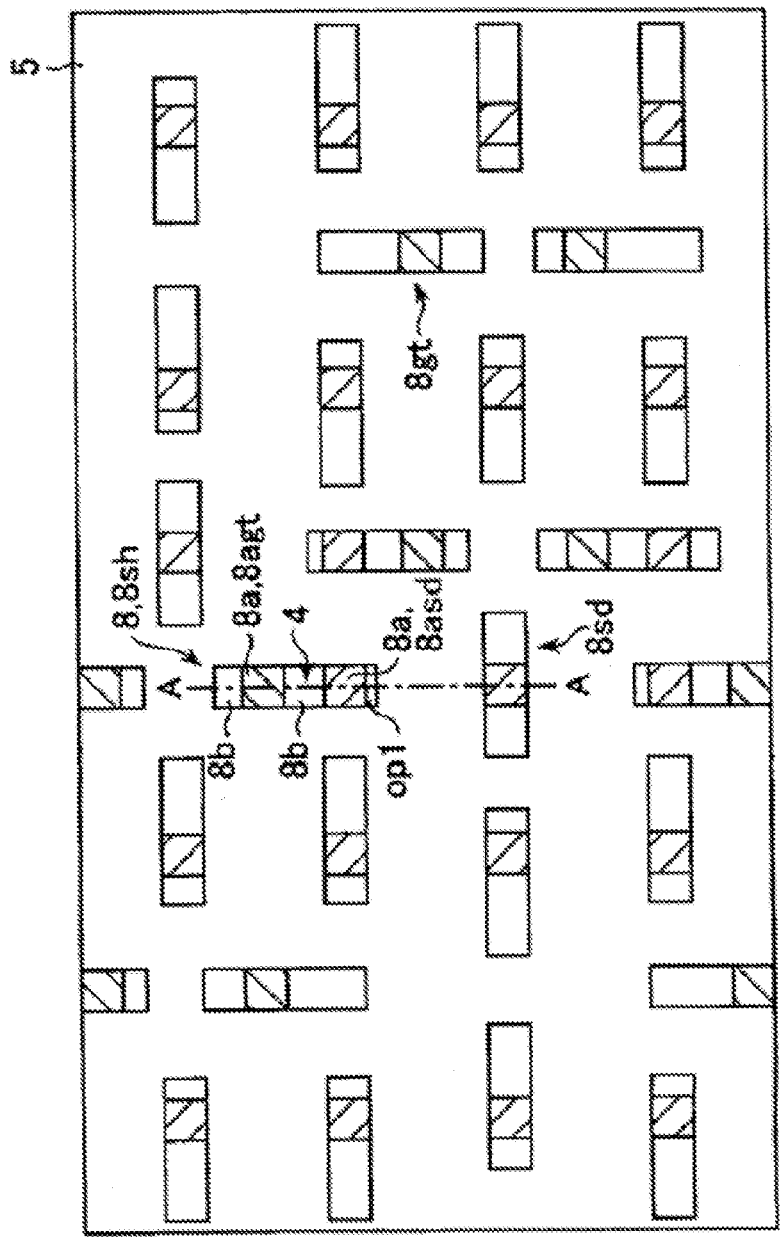

Reference is made to FIG. 6T and FIG. 6A. The resist pattern 7 and the reflection preventing film 6 are removed by ashing treatment and wet cleaning. Contact holes 8 based on Embodiment 1 are formed in this way.

Figure 10:
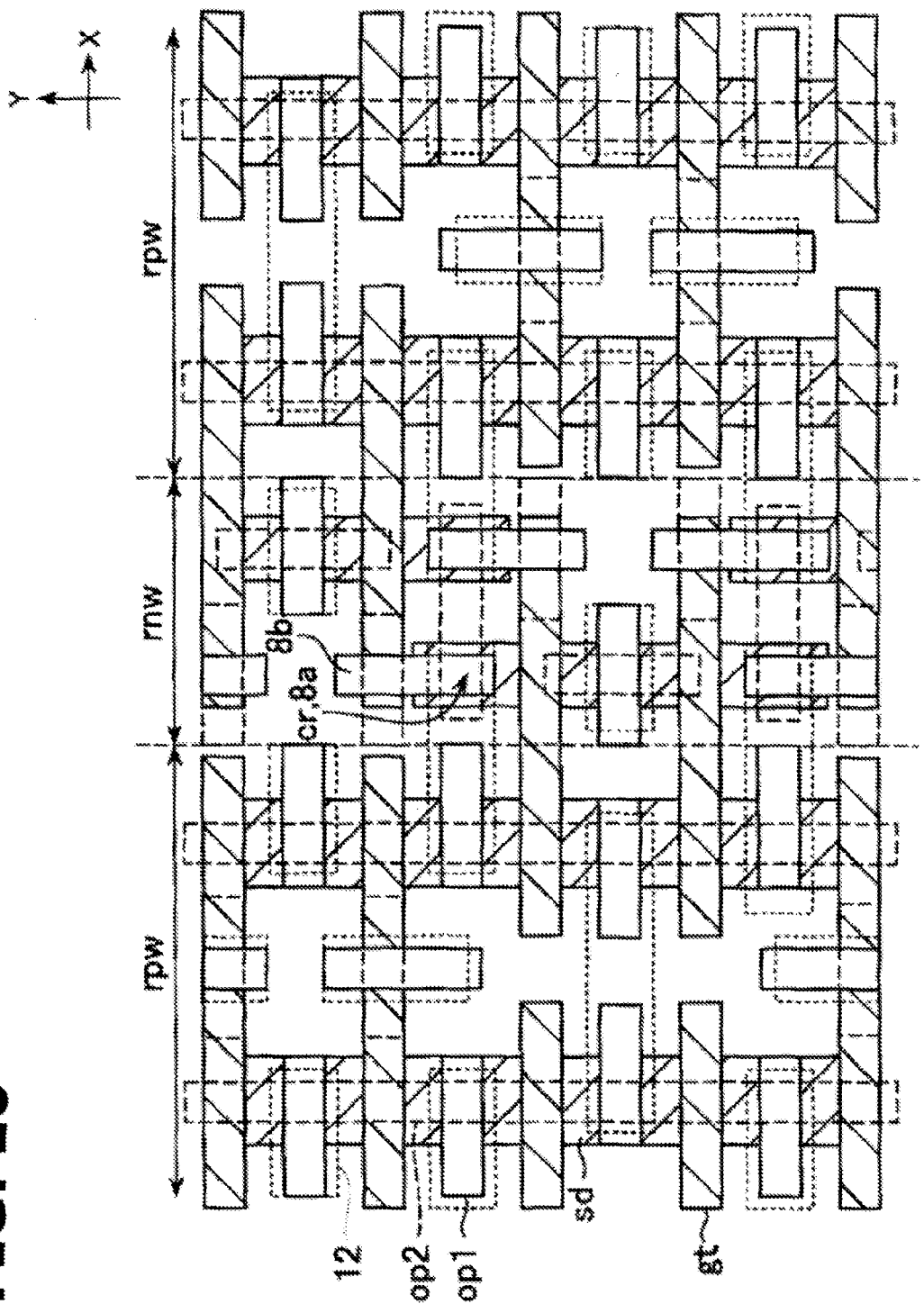
FIG. 10 is a schematic plan view which collectively illustrates source/drain regions, gate electrodes, first pattern openings, second pattern openings, and first layer wirings, all of which are based on Embodiment 1.

FIG. 10 is a schematic plan view that collectively illustrates the source/drain regions sd, gate electrodes gt, openings op1 in the first pattern, openings op2 in the second pattern, and first layer wirings 12 which are to be formed in subsequent steps.

The source/drain regions are illustrated by hatching with lines rising from right to left. The gate electrodes gt are illustrated by hatching with lines rising from left to right. The profiles of the openings op1 in the first pattern are illustrated in solid lines. The profiles of the openings op2 in the second pattern are illustrated in broken lines. The profiles of the first layer wirings 12 are illustrated in dotted lines. The explanation will be continued by making reference not only to FIG. 6T and FIG. 6A but also to FIG. 10.

Intersections cr, where the openings op1 in the first pattern intersect the openings op2 in the second pattern, are regions where the interlayer insulating film 4 is removed in the second etching to form deep recesses 8a. In other words, the openings op1 formed in the first pattern and the openings op2 formed in the second pattern, which mutually intersect at right angles, are set so that the regions where the deep recesses 8a are to be formed are demarcated as intersections cr. The profiles of the intersections cr between the rectangular openings op1 in the first pattern and the rectangular openings op2 in the second pattern, that is, the profiles of the recesses 8a, are rectangular.

The width of each of the openings op1 is 30 nm, for example. The width of each of the openings op2 is 30 nm, for example. The intersections cr each have the shape of a square with a side length of 30 nm. The intersections cr disposed in a plane have the same shape. Since the intersections cr have the same shape, it is easy to simultaneously form a plurality of recesses 8a in the second etching.

In regions where contact plugs to be connected to source/drain regions sd are to be formed in subsequent steps, intersections cr are disposed in such source/drain regions sd, and recesses 8asd, where such source/drain regions sd are exposed, are formed.

In regions where contact plugs to be connected to gate electrodes gt are to be formed in subsequent steps, intersections cr are disposed in such gate electrodes gt, and recesses 8agt, where such gate electrodes gt are exposed, are formed.

On the other hand, those regions inside the openings op1 in the hard mask 5 which are outside the intersections cr are regions where the interlayer insulating film 4 is not removed by the second etching. In such regions, shallow recesses 8b, where the interlayer insulating film 4 is exposed at the bottom, are formed by the first etching.

The contact holes 8 as a whole have a shape in which a deep recess 8a is disposed in a portion of a shallow recess 8b. In the hard mask 5, the profile of each of the openings op1 disposed in the first patterns agrees with the overall profile of each of the contact holes 8.

The following three types of contact holes 8 are formed: contact holes 8sd which have recesses 8asd as deep recesses and in which only source/drain regions are exposed; contact holes 8gt which have recesses 8agt as deep recesses and in which only gate electrodes gt are exposed; and contact holes 8sh which have recesses 8asd and recesses 8agt as deep recesses and in which both source/drain regions sd and gate electrodes gt are exposed.

In regions where contact holes 8sd are formed, the apertures of the openings op1 in the first pattern are long in a direction (X-direction) parallel to the gate electrodes, and the apertures of the openings opt in the second pattern are long in a direction (Y-direction) perpendicularly intersecting the openings op1 in the first pattern.

In regions where contact holes 8gt are formed, the apertures of the openings op1 in the first pattern are long in a direction (Y-direction) perpendicularly intersecting the gate electrodes gt, and the apertures of the openings op2 in the second pattern are long in a direction (X-direction) perpendicularly intersecting the openings op1 in the first pattern.

In regions where contact holes 8sh are formed, the apertures of the openings op1 in the first pattern are long in a direction (Y-direction) perpendicularly intersecting the gate electrodes gt, and the apertures of the openings op2 in the second pattern are long in a direction (X-direction) perpendicularly intersecting the openings op1 in the first pattern.

In this embodiment, the intersections cr are rectangular or have the shape of a square with a side length of 30 nm. However, corners may be rounded at the bottom of the deep recesses 8a, which are formed by the second etching, and as a result, a circular shape may be formed. Such a case occurs for the following reason: If, during the second etching, the etching rate for the corner portions of the rectangular shape of the intersections cr is low, or if reaction by-products due to etching stick to the corner portions, then the etching of the corner portions is restricted, and as the etching of the recesses 8a progresses in the depth direction, the corner portions disappear, with the result that the rectangular shape changes to a circular shape.

Figure 7A:
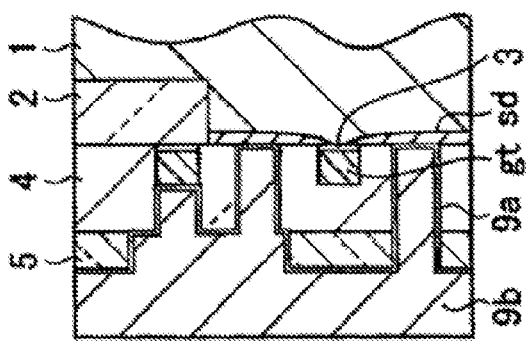
Figure 7T:
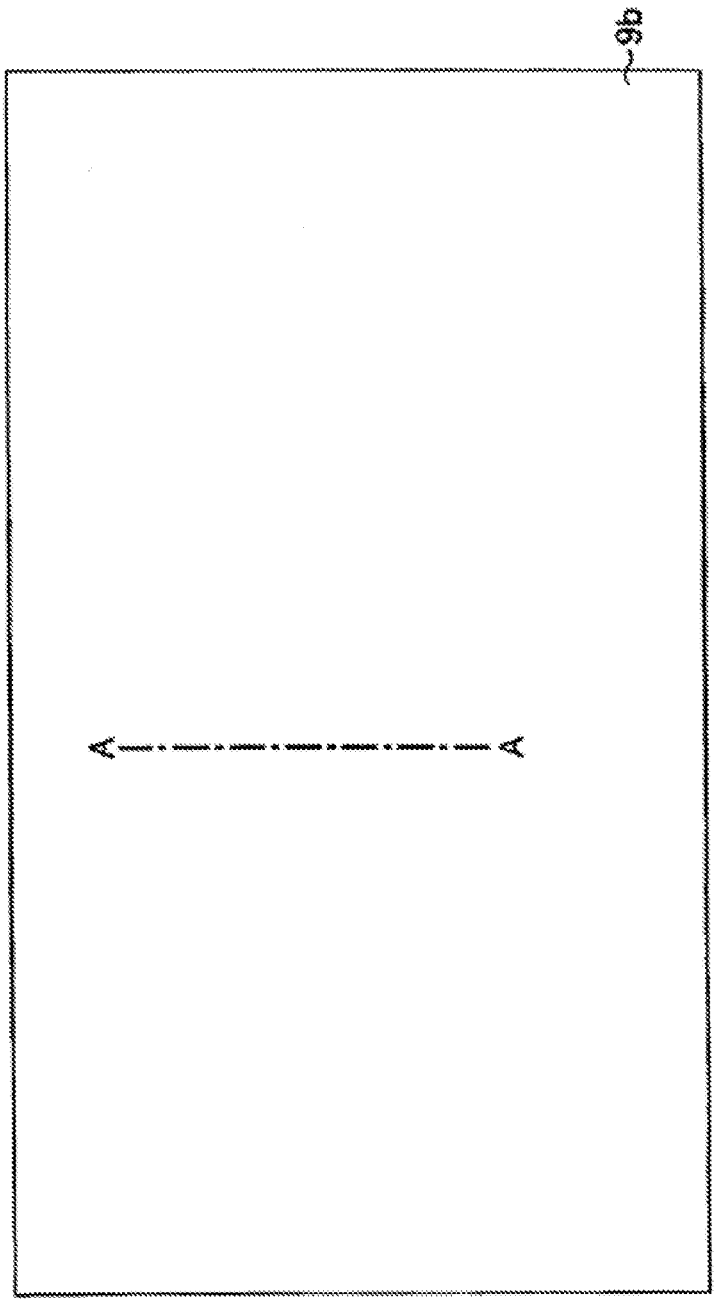

Reference is made to FIG. 7T and FIG. 7A. A film 9a (hereinafter referred to as a "glue film 9a") which covers the inner surface of contact holes 8 and serves as a glue film and a barrier film is formed. The glue film 9a is formed, for example, by laminating Ti and TiN by means of CVD or physical vapor deposition (PVD). Another material such as W, Ta, TaN, or Ru can be used as the material for the glue film 9a.

The contact hole is filled up, for example, by depositing W on the glue film 9a by means of CVD, resulting in a conductive film 9b being formed. Another material such as TiN, Ti, TaN, Ta, or Cu can be used as the material for the conductive film 9b.

Reference is made to FIG. 8T and FIG. 8A. The conductive film 9b and the glue film 9a, both of which are formed on the hard mask 5, are polished and removed by means of CMP, resulting in the hard mask 5 being exposed. In this way, a contact plug 10 is formed in each of the contact holes 8. The hard mask 5, which was used as mask in the second etching, is not removed but is left as interlayer insulating film 5. The upper surface of interlayer insulating film 5 and the upper surface of each contact plug 10 are even (flush) with each other. Thus the upper surfaces of the contact plugs 10 are planarized.

The contact plugs 10 include column sections 10a formed in deep recesses 8a of the contact holes 8, and flange sections 10b formed in shallow recesses 8b of the contact holes 8. The column sections 10a form columnar portions which extend in the interlayer insulating film thickness direction. The flange sections 10b form flange-like portions which jut out in an in-plane direction (direction parallel to the surfaces of the interlayer insulating film) from the upper portions of the column sections 10a. The column sections 10a are disposed in the interlayer insulating film 4. The flange sections 10b are disposed in the interlayer insulating film 5, which was used as hard mask. In this embodiment, the thickness of the flange sections 10b is smaller than the thickness (length) of the column sections 10a.

The flange sections 10b are formed so as to conform to the shape of the openings op1 in the first pattern. The column sections 10a are formed at the intersections of the openings op1 in the first pattern and the openings opt in the second pattern. Therefore, that dimension of the column sections 10a which is in a direction intersecting the direction in which the flange sections 10b jut out is equal to that dimension of the flange sections 10b which is in the first above-mentioned direction.

The following three types of contact plugs 10 are formed: contact plugs 10sd which are formed in contact holes 8sd and connect only to source/drain regions sd; contact plugs 10gt which are formed in contact holes 8gt and connect only to gate electrodes gt; and contact plugs 10sh which are formed in contact holes 8sh and connect to both source/drain regions sd and gate electrodes gt.

FIG. 8P is a schematic perspective view illustrating the shapes of the contact plugs 10. For the purpose of making the illustration easy to understand, the interlayer insulating film 4 and the interlayer insulating film 5 are omitted. FIG. 8P illustrates a contact plug 10sd, which connects only to a source/drain region sd, and a contact plug 10sh, which connects to both the source/drain region sd and a gate electrode gt.

The contact plug 10sd includes a column section 10asd, which is in contact with the source/drain region sd. Since the contact plug 10sd is formed using the opening op1 which extends in a direction (X-direction) parallel to the gate electrode gt, the flange section 10b juts out in the X-direction.

The contact plug 10sh is a shared contact plug that includes a column section 10asd, which is in contact with the source/drain region sd, and a 10agt, which is in contact with the gate electrode gt. Since the contact plug 10sh is formed using the opening op1 which extends in a direction (Y-direction) perpendicularly intersecting the gate electrode gt, the flange section 10b juts out in the Y-direction from the upper part of each column section 10a. The flange section 10b connects the column section 10asd and the column section 10agt to each other.

Other than the above, the contact plug 10gt includes a column section 10agt, which is in contact with a gate electrode gt. Since the contact plug 10gt is formed using opening op1 which extends in a direction (Y-direction) perpendicularly intersecting the gate electrode gt, the flange section 10b juts out in the Y-direction.

Hereinafter, the contact plug 10sd or the contact plug 10gt may be called an ordinary contact plug, as distinct from the shared contact plug 10sh.

In this embodiment, since intersections are formed at intermediate positions in the longitudinal directions of the openings in the first pattern, a structure is formed in which flange sections jut out on both sides of the intersections (outside of both sides of column sections). In this regard, it is also possible to form intersections at the longitudinal ends of the openings in the first patterns. In this case, a structure is formed in which a flange section juts out on one side of each intersection (outside of one side of each column section). However, from the point of view of reliably forming intersections, wider latitude is allowed in mislocation if intersections are formed at intermediate positions in the longitudinal directions of the openings in the first patterns.

As mentioned above, it is possible to perform layout design so that each flange section juts out on both sides, while it is also possible to perform layout design so that each flange section juts out on one side. In this regard, even if layout design is performed so that each flange section juts out on both sides, it can happen that due to mislocation in actual processes, jutting-out occurs only on one side in a completed structure. Also, even if layout design is performed so that each flange section juts out on one side, it can happen that due to mislocation in actual processes, jutting-out occurs only on both sides in a completed structure.

Reference is made to FIG. 9T and FIG. 9A. For example, SiOC is deposited on interlayer insulating film 5 by means of CVD, or a porous low dielectric material is applied thereto, so that contact plugs 10 are covered, thereby forming an interlayer insulating film 11. A resist pattern which has openings in a pattern for forming first layer wirings are formed on the interlayer insulating film 11. By using this resist pattern as mask, the interlayer insulating film 11 is etched, thereby forming wiring grooves.

A barrier metal film is formed on the interlayer insulating film 11 to cover the wiring grooves. The barrier metal film is formed, for example, by depositing TaN or Ta by means of sputtering. For example, Cu is deposited on the barrier metal film by means of sputtering, thereby forming a seed film. Cu is deposited on the seed film by means of electrolytic plating. Then unnecessary Cu film, seed film, and barrier metal film on the upper surfaces of the interlayer insulating film 11 are removed by means of CMP, thereby forming first layer wirings 12.

Furthermore, multilayer wirings are formed above the interlayer insulating film 11. By way of a method of forming multilayer wirings, it is possible to use publicly known technology accordingly. In this way, a semiconductor device based on Embodiment 1 is formed.

By making reference to FIG. 11 and FIG. 12, an explanation will be made of items such as matters related to connection between MOS transistors forming an SRAM based on Embodiment 1.

Figure 11:
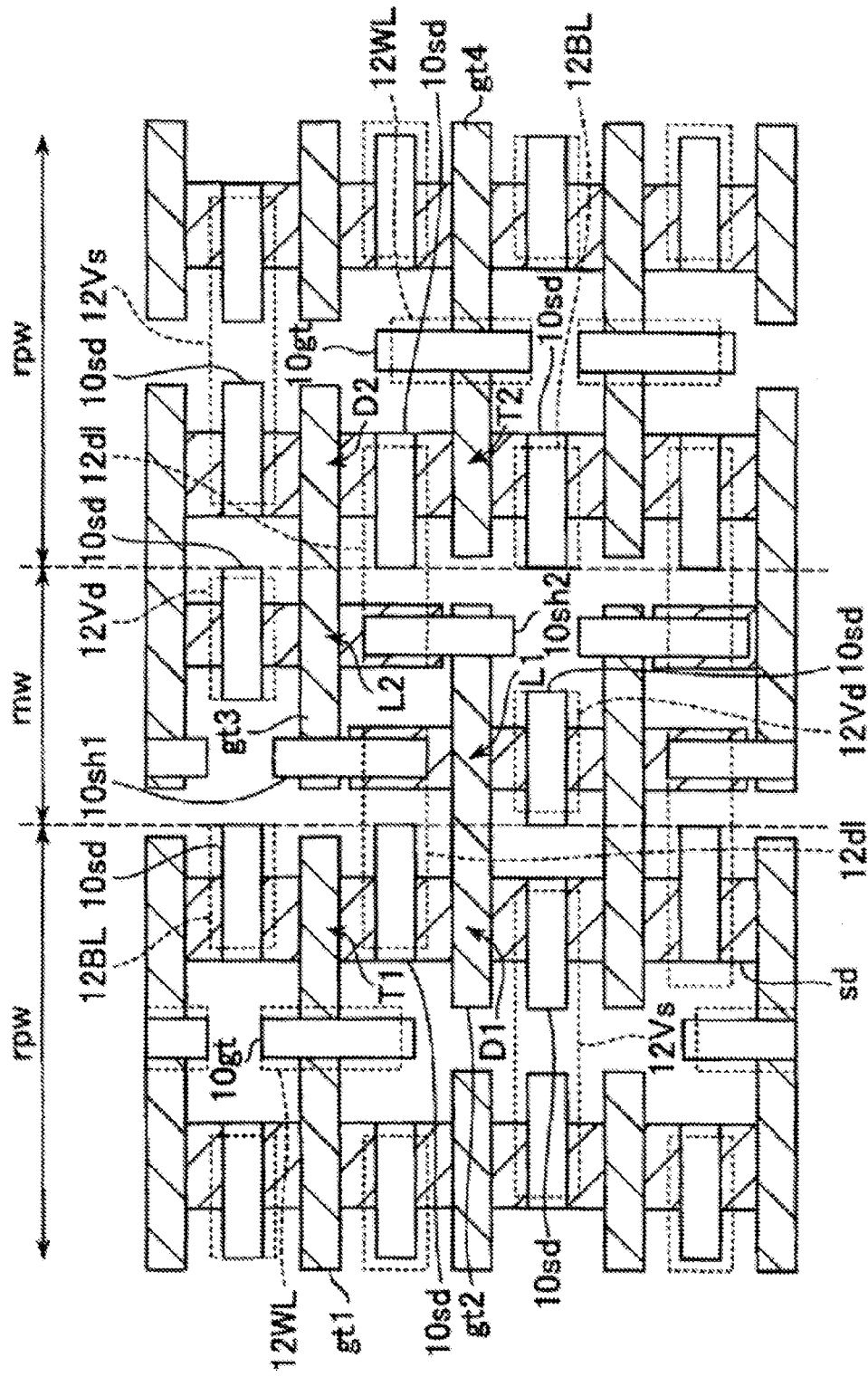
FIG. 11 is a schematic plan view which collectively illustrates source/drain regions, gate electrodes, contact plugs, and first layer wirings, all of which are based on Embodiment 1.

FIG. 11 is a schematic plan view which collectively illustrates source/drain regions sd, gate electrodes gt, contact plugs 10, and first layer wirings 12. In this regard, each of the openings op1 disposed in the first pattern corresponds to the profile of each of the contact plugs 10. Therefore, in FIG. 11, the openings op1 given in FIG. 10 are indicated as contact plugs 10. Furthermore, in FIG. 11, the openings opt in the second pattern are omitted.

Figure 12:
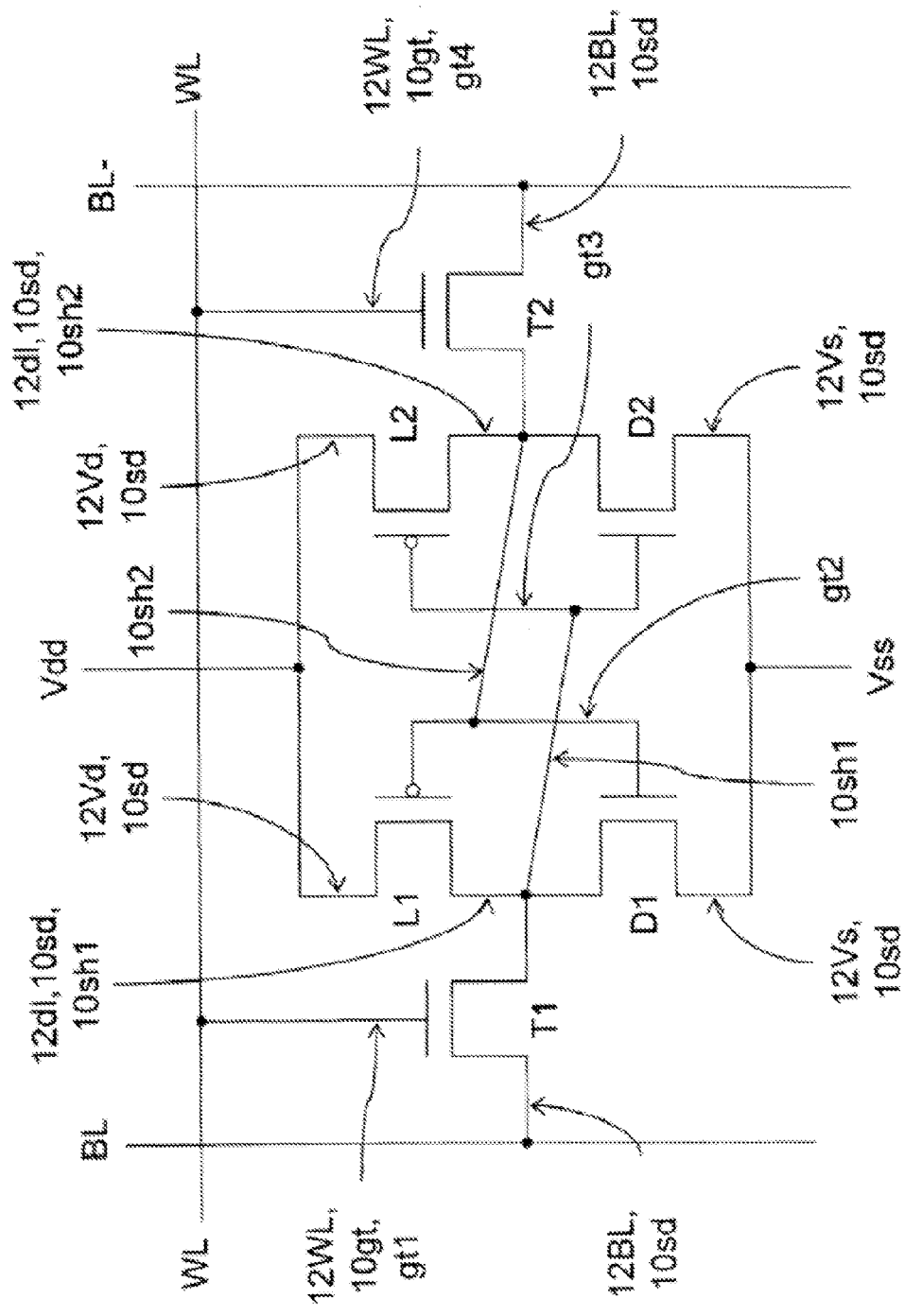
FIG. 12 is an SRAM circuit diagram based on Embodiment 1.

FIG. 12 is a circuit diagram of an SRAM based on Embodiment 1.

A word line WL is connected to a gate electrode gt1 of a transfer transistor T1 via a first layer wiring 12WL and a contact plug 10gt.

A bit line BL is connected to a bit line side source/drain region sd of the transfer transistor T1 via a first layer wiring 12BL and a contact plug 10sd.

A memory side source/drain region sd of the transfer transistor T1 is connected to a power supply voltage side source/drain region sd of a drive transistor D1 (the memory side source/drain region sd of the transfer transistor T1 and the power supply voltage side source/drain region sd of the drive transistor D1 are common to each other).

A grounding voltage Vss is connected to a grounding voltage side source/drain region sd of the driver transistor D1 via a first layer wiring 12Vs and a contact plug 10sd.

A gate electrode gt2 of the driver transistor D1 is connected to a gate electrode gt2 of a load transistor L1 (the gate electrode gt2 is common to the driver transistor D1 and the load transistor L1).

The power supply voltage side source/drain region sd of the driver transistor D1 is connected to a grounding voltage side source/drain region sd of the load transistor L1 via a first layer wiring 12d1. A contact plug 10sd establishes connection between the power supply voltage side source/drain region sd of the driver transistor D1 and the first layer wiring 12d1. A contact plug 10sh1 establishes connection between the grounding voltage side source/drain region sd of the load transistor L1 and the first layer wiring 12d1.

A power supply voltage Vdd is connected to a power supply voltage side source/drain region sd of the load transistor L1 via a first layer wiring 12Vd and a contact plug 10sd.

The grounding voltage side source/drain region sd of the load transistor L1 is connected to a gate electrode gt3 of a load transistor L2 via a contact plug 10sh1. The contact plug 10sh1 is a shared contact plug which is connected to both the grounding voltage side source/drain region sd of the load transistor L1 and the gate electrode gt3 of a load transistor L2.

A grounding voltage side source/drain region sd of the load transistor L2 is connected to the gate electrode gt2 of the load transistor L1 via a contact plug 10sh2. The contact plug 10sh2 is a shared contact plug which is connected to both the grounding voltage side source/drain region sd of the load transistor L2 and the gate electrode gt2 of the load transistor L1.

The power supply voltage Vdd is connected to a power supply voltage side source/drain region sd of the load transistor L2 via a first layer wiring 12Vd and a contact plug 10sd.

The grounding voltage side source/drain region sd of the load transistor L2 is connected to a power supply voltage side source/drain region sd of a driver transistor D2 via a first layer wiring 12d1. The contact plug 12sh2 establishes connection between the grounding voltage side source/drain region sd of the load transistor L2 and the first layer wiring 12d1. The contact plug 10sd establishes connection between the power supply voltage side source/drain region sd of the driver transistor D2 and the first layer wiring 12d1.

The gate electrode gt3 of the load transistor L2 is connected to a gate electrode gt3 of the driver transistor D2 (the gate electrode gt3 is common to the load transistor L2 and the driver transistor D2).

The power supply voltage side source/drain region sd of the driver transistor D2 is connected to a memory side source/drain region sd of a transfer transistor T2 (the power supply voltage side source/drain region sd of the driver transistor D2 and the memory side source/drain region sd of the transfer transistor T2 are common to each other).

The grounding voltage Vss is connected to a grounding voltage side source/drain region sd of the driver transistor D2 via the first layer wiring 12Vs and the contact plug 10sd.

A word line WL is connected to a gate electrode gt4 of the transfer transistor T2 via a first layer wiring 12WL and a contact plug 10gt.

An inversion bit line BL− is connected to an inversion bit line side source/drain region sd of the transfer transistor T2 via a first layer wiring 12BL and a contact plug 10sd.

In this way, an SRAM based on Embodiment 1 is formed of transfer transistors T1 and T2, driver transistors D1 and D2, and load transistors L1 and L2.

In the next place, an explanation will be made of a semiconductor device based on a comparative example.

Figure 32:
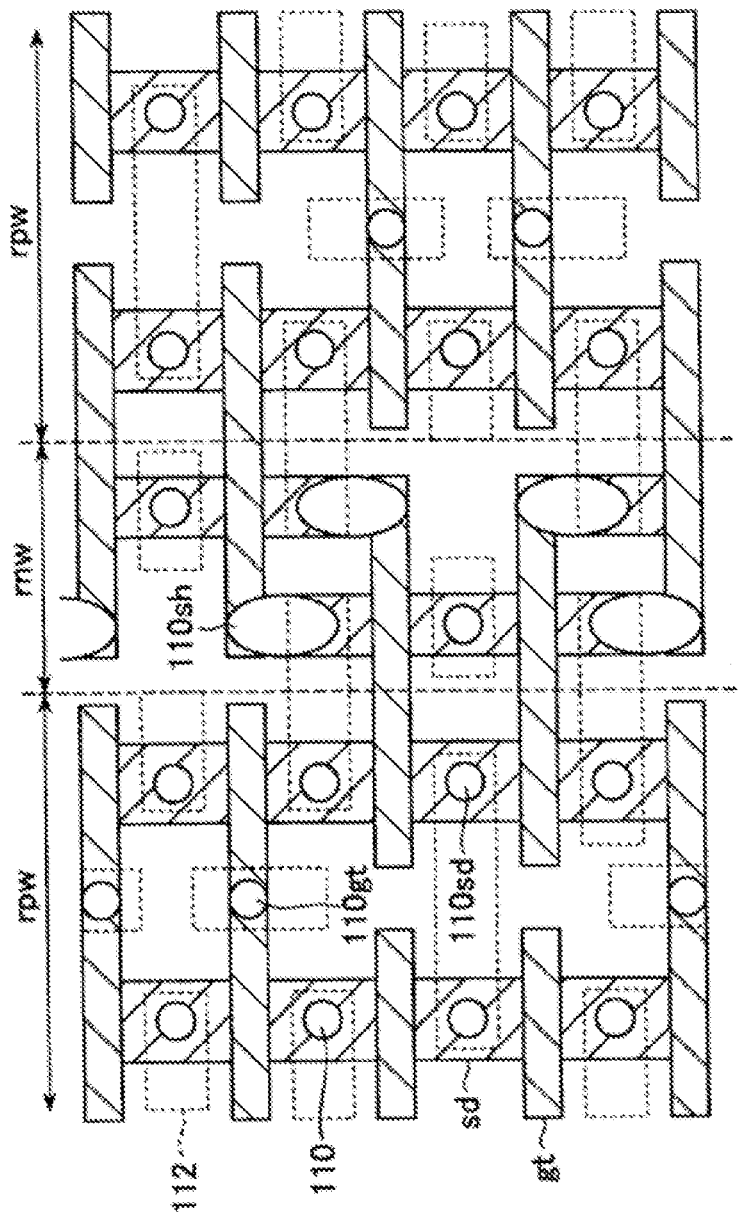
FIG. 32 is a schematic plan view which illustrates a semiconductor device based on a comparative example.

FIG. 32 is a schematic plan view illustrating the semiconductor device based on the comparative example. Transistors are disposed in a pattern similar to those in Embodiment 1, and an SRAM is formed to have a connection structure similar to those in Embodiment 1. Contact plugs 110 to be connected to the transistors are different from those in Embodiment 1. First layer wirings 112 are formed on the contact plugs 110.

The method of forming the contact plugs 110 in the comparative example will be explained. A resist pattern in which openings are made due to the formation of the contact plugs 110, is formed on an interlayer insulating film which is formed so as to cover the transistors. The interlayer insulating film is etched, thereby forming contact holes. The contact holes are filled up by means of W film so that glue film which is, for example, formed of Ti is interposed in between. Excess W film and glue film are removed by means of CMP. Thus the contact plugs 110 are formed.

The following three types of contact plugs are formed: contact plugs 110sd which connect only to the source/drain regions; contact plugs 110gt which connect only to the gate electrodes; and contact plugs 110sh which are shared contact plugs that connect to both source/drain regions and gate electrodes.

The contact holes for the shared contact plugs 110sh are formed so as to extend over the source/drain regions and the gate electrodes, and are, therefore, formed to be larger than the contact holes for the ordinary contact plugs 110sd or 110gt. As compared to the fact that the ordinary contact holes have circular cross sections, the contact holes for the shared contact plugs 110sh are formed to have a larger circular or elliptic shape.

That is, in the comparative example, contact holes with different sizes are formed in a plane. In the case of simultaneous formation of contact holes with different sizes, it is difficult to form resist patterns by means of lithography or to perform hole-forming etching.

In this regard, in the case of the shared contact plugs in the comparative example, it is necessary that, for example, portions having elliptic cross sections be disposed so as to extend over both source/drain regions and gate electrodes. For this reason, connection deficiencies are liable to occur in which due to mislocation, it is impossible to secure electrical continuity with both the source/drain regions and the gate electrodes. If the size of the shared contact plugs is increased, such connection deficiencies can be easily resolved, while on the other hand, short-circuit deficiencies with respect to adjacent regions are liable to occur.

In Embodiment 1, a contact plug 10sh includes a column section 10asd, which is in contact with a source/drain region, and a column section 10agt, which is in contact with a gate electrode. Furthermore, these column sections 10a are connected to each other by a flange section 10b. Thus the contact plug 10sh can be made a shared contact plug.

In Embodiment 1, the size of a column section 10a of an ordinary contact plug 10sd or 10gt and the size of each column section 10a of a shared contact plug 10sh can be easily made uniform. If this is done, it becomes easy to perform etching etc. whereby a plurality of recesses 8a in which column sections 10a are to be embedded, are formed simultaneously. Furthermore, short-circuit deficiencies, which are liable to occur by enlarging shared contact plugs in the comparative example, are curbed in Embodiment 1.

In the next place, an explanation will be made of a semiconductor device based on Embodiment 2. A logic circuit is formed in Embodiment 2. The logic circuit in Embodiment 2 is, for example, one which is formed simultaneously with an SRAM circuit in Embodiment 1.

FIG. 13T to FIG. 21T are schematic plan views illustrating main steps in a method of manufacturing a semiconductor device based on embodiment 2. FIG. 13A to FIG. 21A and FIG. 13B to FIG. 21B are schematic cross-sectional views illustrating main steps in the method of manufacturing the semiconductor device based on Embodiment 2. The symbol "T" is assigned to plan views. The symbol "A" is assigned to cross-sectional views along dashed-dotted lines AA. The symbol "B" is assigned to cross-sectional views along dashed-dotted lines BB.

Figure 13A:
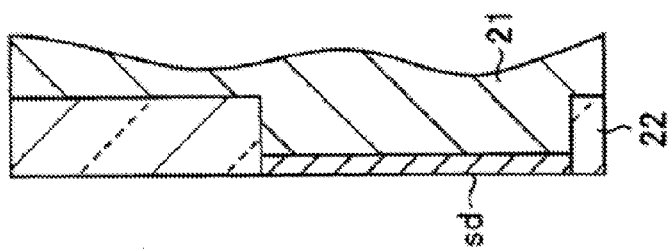
Figure 13T:
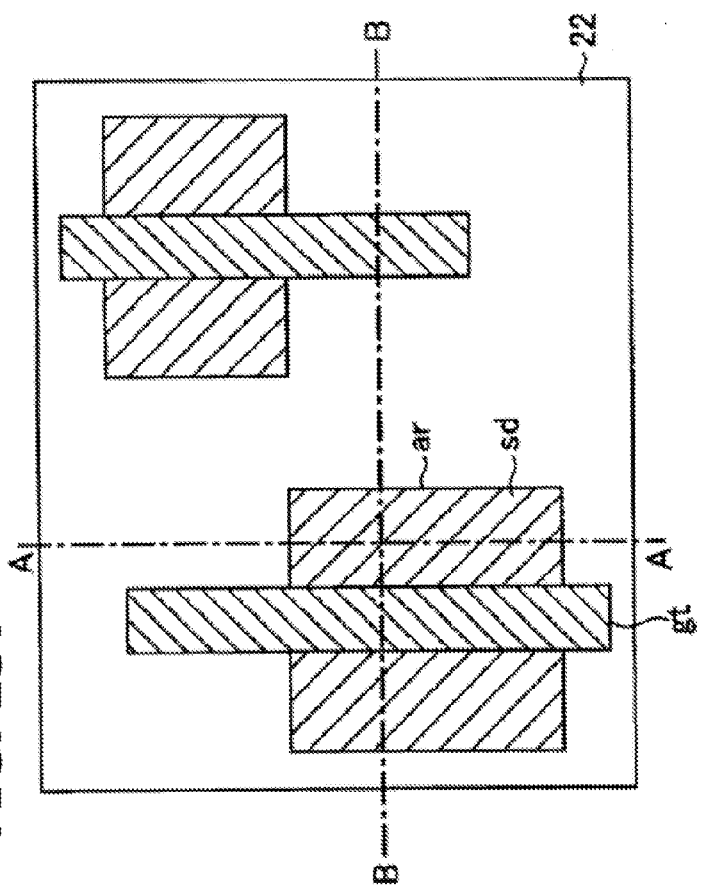
Figure 13B:
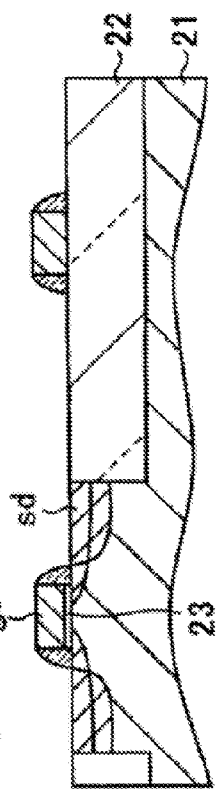

Reference is made to FIG. 13T, FIG. 13A, and FIG. 13B. An element separating insulating film 22 is formed, for example, on a semiconductor substrate (silicon substrate, for example) 21 by means of shallow trench isolation (STI), thereby demarcating active regions ar. P-type impurity is injected into n-type MOS transistor forming regions, thereby forming p-type wells. N-type impurity is injected into p-type MOS transistor forming regions, thereby forming n-type wells.

A conductive film which is formed of polysilicon, for example, is deposited on the silicon substrate 21 so that a gate insulating film 23 which is formed of silicon oxide, for example, is interposed in between. The conductive film is patterned, thereby forming gate electrodes gt. In n-type MOS transistor forming regions, by using gate electrodes gt as mask, n-type impurity is injected into the p-type wells, thereby forming low concentration n-type source/drain regions sd. In p-type MOS transistor forming regions, by using gate electrodes gt as mask, p-type impurity is injected into the n-type wells, thereby forming low concentration p-type source/drain regions sd. In the plan view 13T, the gate electrodes gt are illustrated by hatching with lines rising from left to right, and the low concentration source/drain regions sd are illustrated by hatching with lines rising from right to left.

Subsequently, sidewall spacer insulating films are formed on the side surfaces of the gate electrodes gt. Then in the n-type MOS transistor forming regions, by using gate electrodes gt and sidewall spacer insulating films as mask, n-type impurity is injected, thereby forming high concentration n-type source/drain regions. In the p-type MOS transistor forming regions, by using gate electrodes gt and sidewall spacer insulating films as mask, p-type impurity is injected, thereby forming high concentration p-type source/drain regions. Furthermore, the source/drain regions and the upper surfaces of the gate electrodes are silicidized. MOS transistors are formed in this way, for example.

The cross-sectional view 13B illustrates sidewall spacer insulating films and high concentration source/drain regions.

In this regard, transistor forming methods are not limited to the above-mentioned example. It is sufficient if gate electrodes are formed with gate insulating films interposed in contact therewith. Gate insulating films are not limited to $SiO_2$ films. High-k films can also be used. The whole, or at least the surfaces, of the gate electrodes can be formed of a low-resistance material such as metal, silicide, or alloy. The surfaces of source/drain impurity diffusion layers are formed of a low-resistance material such as silicide, metal, or alloy. Furthermore, SiGe etc. can also be used. The source/drain impurity diffusion layers are separated from the gate electrodes by gate insulating films and by insulating material articles such as sidewall-like spacers.

The type of transistors may be any of the following: the planar type, the multi-gate type, etc. In this regard, it is preferable that the transistors are so structured that gate electrodes and source/drains are exposed, as seen from the directions of the surfaces. It is possible to change, as appropriate, the widths, the lengths, and the numbers of the gate electrodes and the source drain electrodes. The materials for the electrodes and the insulating films can be changed so as to be compatible with intended uses.

Figure 14A:
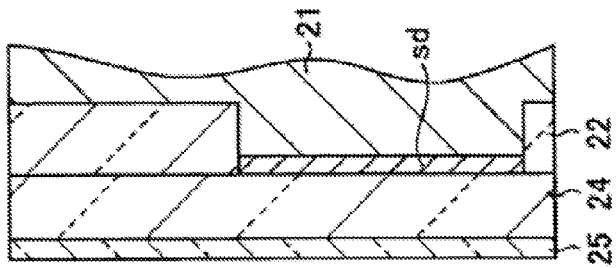
Figure 14T:
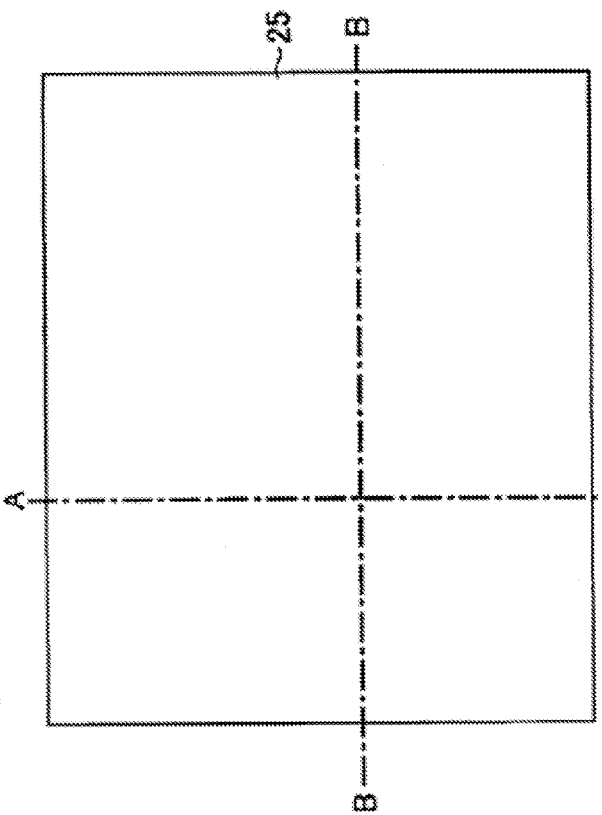
Figure 14B:
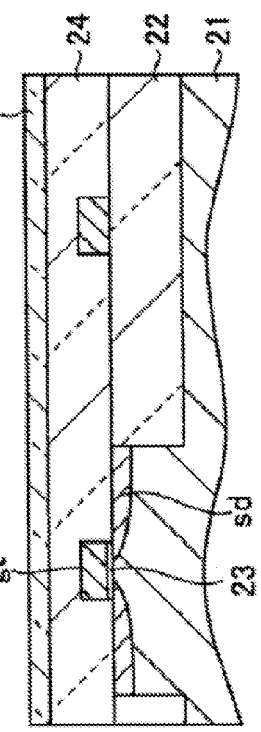

Reference is made to FIG. 14T, FIG. 14A, and FIG. 14B. For example, similarly to the case of an interlayer insulating film 4 in Embodiment 1, an interlayer insulating film 24 is formed on a silicon substrate 21 so that the MOS transistors are covered. The surface of the interlayer insulating film 24 is planarized by means of CMP. For example, similarly to the case of a hard mask film 5 in Embodiment 1, a hard mask film 25 is formed on the interlayer insulating film 24.

In this regard, a compressive or tensile contact etch stop layer (CESL) may be provided under the interlayer insulating film 24 so that the gate electrodes and the source/drain regions are covered. The contact etch stop layer is formed of an SiN film, for example.

Figure 15A:
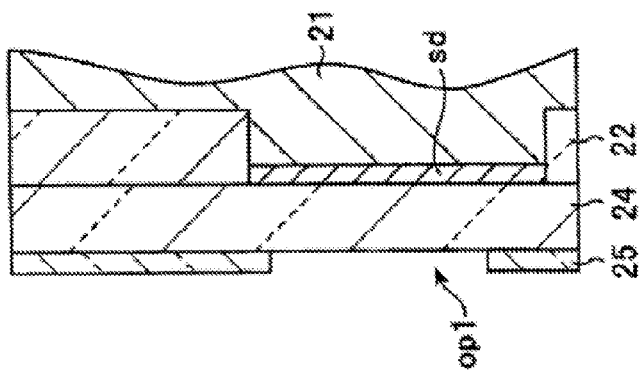
Figure 15T:
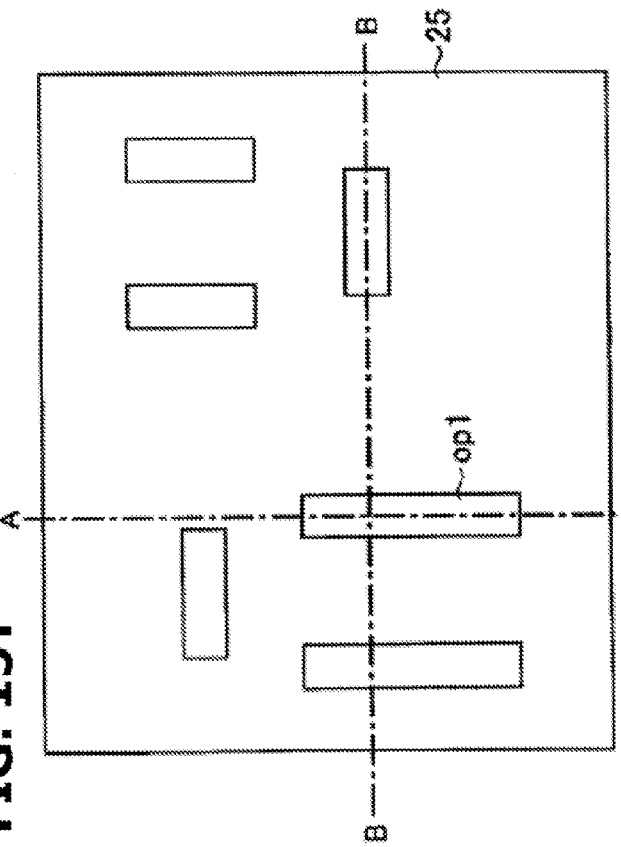
Figure 15B:
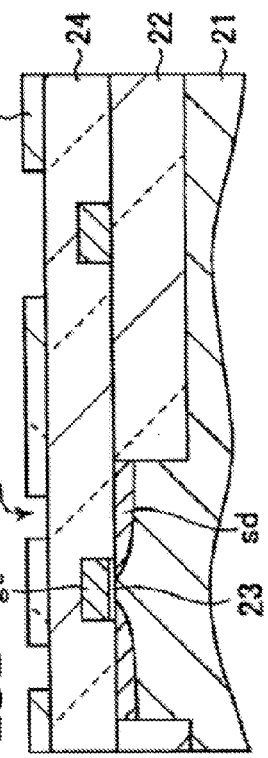

Reference is made to FIG. 15T, FIG. 15A, and FIG. 15B. A reflection preventing film is formed on the hard mask film 25. A resist pattern in which openings op1 are formed in a first pattern for forming contact holes, are formed on the reflection preventing film.

By way of the first etching, by using this resist pattern as mask, the reflection preventing film and the hard mask film 25 are etched by RIE. The etching conditions for the first etching are, for example, similar to those for the first etching in Embodiment 1. The hard mask film 25, in which openings op1 are formed in the first pattern, is formed in the first etching. The openings op1, which are formed in the hard mask 25, serve as recesses 27b in which flange sections 29b are to be embedded in subsequent steps.

Figure 16A:
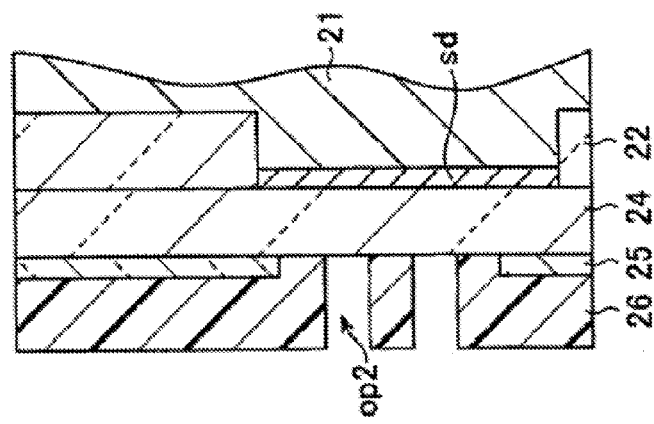
Figure 16T:
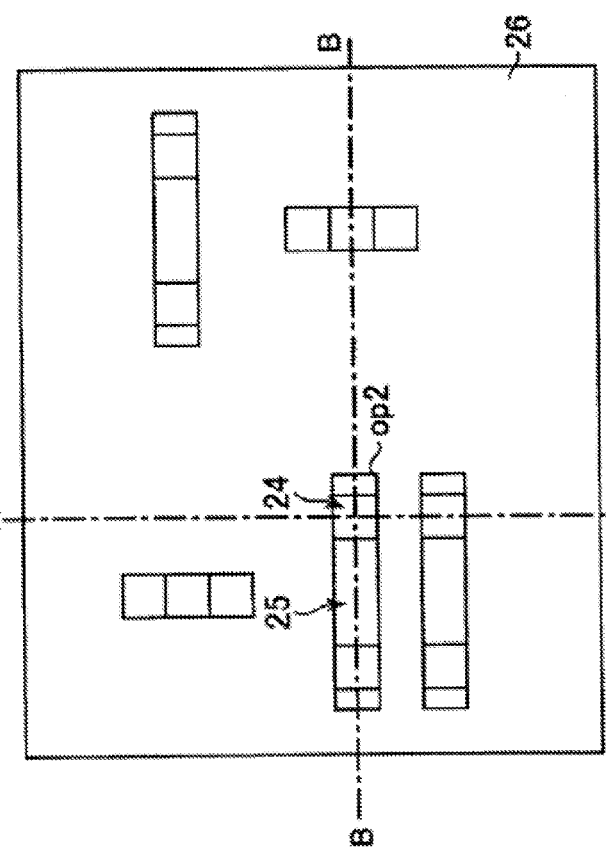
Figure 16B:
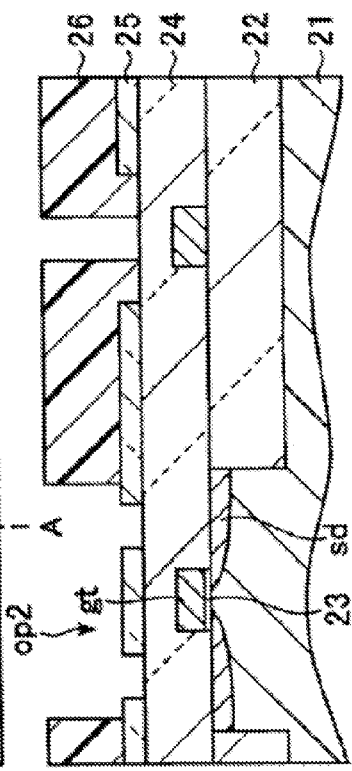

Reference is made to FIG. 16T, FIG. 16A, and FIG. 16B. Photoresist is applied to the hard mask 25. A resist pattern 26 in which openings opt are formed in a second pattern for forming contact holes, is formed by means of photolithography. Unlike Embodiment 1 mentioned above (and Embodiment 3 to be mentioned later), it is also possible, as in Embodiment 2, to form a resist pattern directly on the hard mask film, with no reflection preventing film interposed in between.

Reference is made to FIG. 17T, FIG. 17A, and FIG. 17B. By way of the second etching, by using the resist pattern 26 as mask, the interlayer insulating film 24 is etched by RIE. The etching conditions for the second etching are, for example, similar to those for the second etching in Embodiment 2.

By means of the second etching, the interlayer insulating film 24 is removed, similarly to the case of the second etching in Embodiment 1, at the intersections of the openings opt in the second pattern and the openings op1 in the first pattern, with the result that recesses 27a are formed in which column sections 29a are to be embedded in subsequent steps.

Reference is made to FIG. 18T, FIG. 18A, and FIG. 18B. The resist pattern 26 is removed by means of ashing treatment and wet cleaning. In this way, contact holes 27 are formed in which deep recesses 27a are disposed at the bottom of shallow recesses 27b.

Reference is made to FIG. 19T, FIG. 19A, and FIG. 19B. Similarly to the step explained for Embodiment 1 by making reference to FIG. 7T, FIG. 7A, and FIG. 7B, a glue film 28a and a conductive film 28b are deposited on the hard mask 25 to cover the contact holes 27.

Figure 20A:
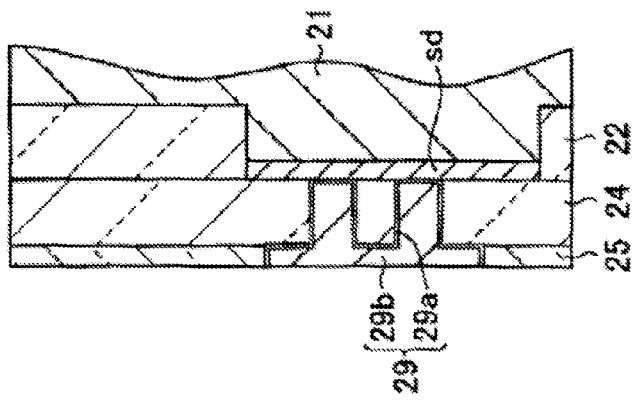
Figure 20T:
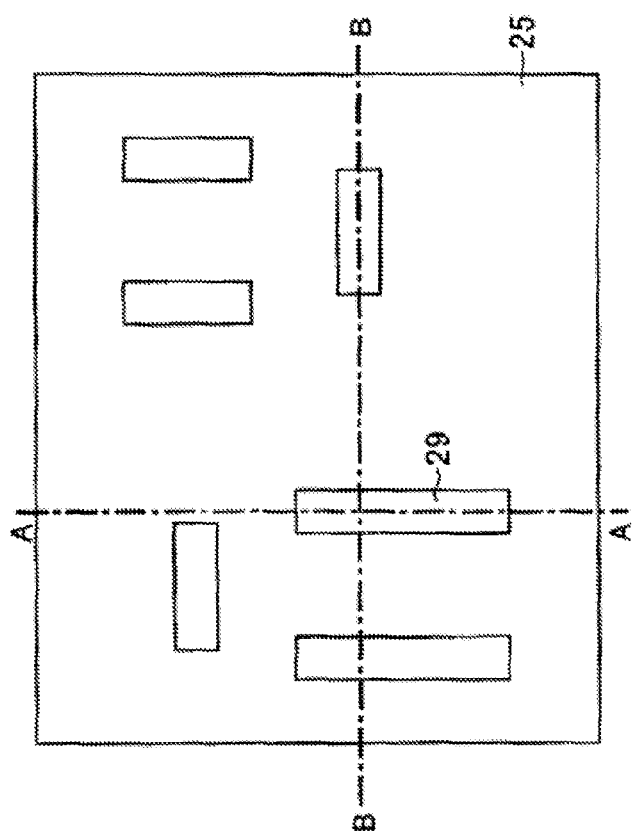
Figure 20B:
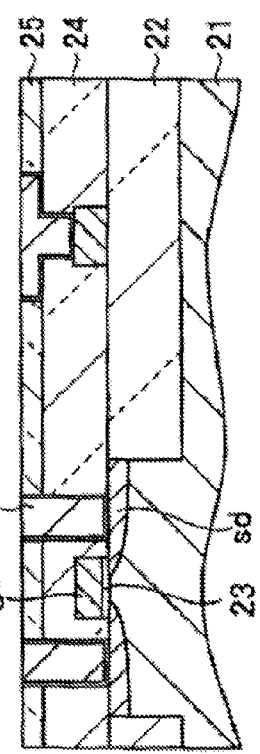

Reference is made to FIG. 20T, FIG. 20A, and FIG. 20B. Furthermore, similarly to the step explained for Embodiment 1 by making reference to FIG. 8T, FIG. 8A, and FIG. 8B, the excess conductive film 28b and glue film 28a are polished and removed by means of CMP, resulting in the hard mask 25 being exposed. In this way, similarly to the case of the contact plugs 10 in Embodiment 1, contact plugs 29 including column sections 29a and flange sections 29b are formed.

Reference is made to FIG. 21T, FIG. 21A, and FIG. 21B. Furthermore, similarly to the step explained for Embodiment 1 by making reference to FIG. 9T, FIG. 9A, and FIG. 9B, and similarly to the steps subsequent to the above-mentioned step, first layer wirings 31 are formed in interlayer insulating film 30, thereby forming multilayer wirings in the upper portion. In this way, a semiconductor device based on Embodiment 2 is formed.

Figure 22:
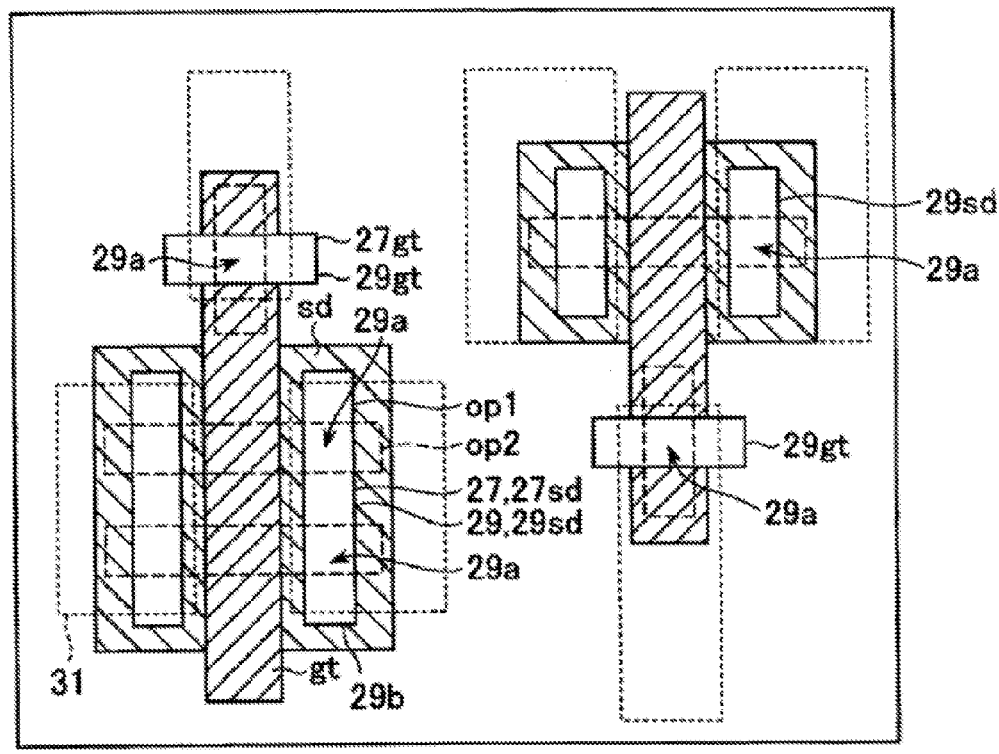
FIG. 22 is a schematic plan view which collectively illustrates source/drain regions, gate electrodes, first pattern openings, second pattern openings, contact plugs, and first layer wirings, all of which are based on Embodiment 2.

FIG. 22 is a schematic plan view collectively illustrating source/drain regions sd, gate electrodes gt, first pattern openings op1, second pattern openings op2, contact holes 27, contact plugs 29, and first layer wirings 31.

In Embodiment 2, shared contact plugs, which connect to source/drain regions and gate electrodes in common, are not formed. The following two types of contact plugs 29 are formed: contact plugs 29sd which connect to the source/drain regions sd; and contact plugs 29gt which connect to the gate electrodes gt. In correspondence to the above, the following two types of contact holes 27 are formed: contact holes 27sd which expose the source/drain regions sd; and contact holes 27gt which expose the gate electrodes gt.

Similarly to the regions where the contact holes 8sd are formed in Embodiment 1, the following is the case with the regions where the contact holes 27sd are formed: The apertures of the openings op1 in the first pattern are long in a direction parallel to the gate electrodes gt; the apertures of the openings op2 in the second pattern are long in a direction perpendicularly intersecting the openings op1 in the first pattern.

Similarly to the regions where the contact holes 8gt are formed in Embodiment 1, the following is the case with the regions where the contact holes 27gt are formed: The apertures of the openings op1 in the first pattern are long in a direction perpendicularly intersecting the gate electrodes gt;

the apertures of the openings op2 in the second pattern are long in a direction perpendicularly intersecting the openings op1 in the first pattern.

As regards the MOS transistor disposed in the right of FIG. 22, a contact plug 29*sd* which connects to a source/drain region sd, and a contact plug 29*gt* which connects to a gate electrode gt, have each a column section 29*a*.

As regards the MOS transistor disposed in the left of FIG. 22, a contact plug 29*gt* which is connected to a gate electrode gt has a column section 29*a*. On the other hand, a contact plug 29*sd* which is connected to a source/drain region sd is so structured that this plug includes two column sections 29*a* which are in contact with a source/drain region sd that is in common, and that the two column sections 29*a* are connected together by a flange section 29*b*. In this way, an ordinary contact plug can also be formed, according to necessity, into a structure in which a plurality of column sections are connected together by a flange section.

In the next place, an explanation will be made of a semiconductor device based on Embodiment 3. Similarly to Embodiment 2, logic circuits are formed in Embodiment 3. Hereinafter, an explanation will be made primarily of differences from embodiment 2. In this regard, identical reference symbols will be used for members and structures which correspond to those in Embodiment 2.

FIG. 23T to FIG. 30T are schematic plan views illustrating main steps in the method of manufacturing the semiconductor device based on Embodiment 3. FIG. 23A to FIG. 30A and FIG. 33B to FIG. 30B are schematic cross-sectional views illustrating main steps in the method of manufacturing the semiconductor device based on Embodiment 3. The symbol "T" is assigned to plan views. The symbol "A" is assigned to cross-sectional views along dashed-dotted lines AA. The symbol "B" is assigned to cross-sectional views along dashed-dotted lines BB.

In the first place, MOS transistors are formed on a silicon substrate 21, as explained for Embodiment 2 by making reference to FIG. 13T, FIG. 13A and FIG. 13B.

Figure 23A:
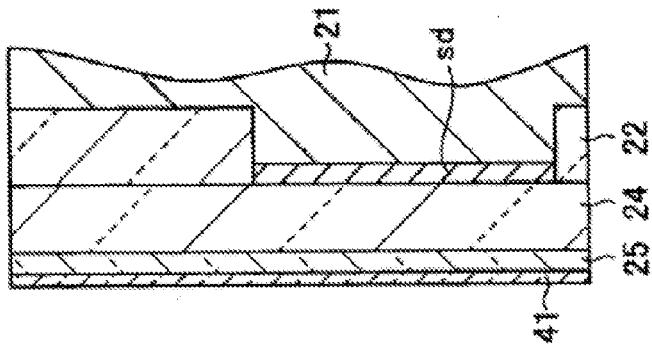
Figure 23T:
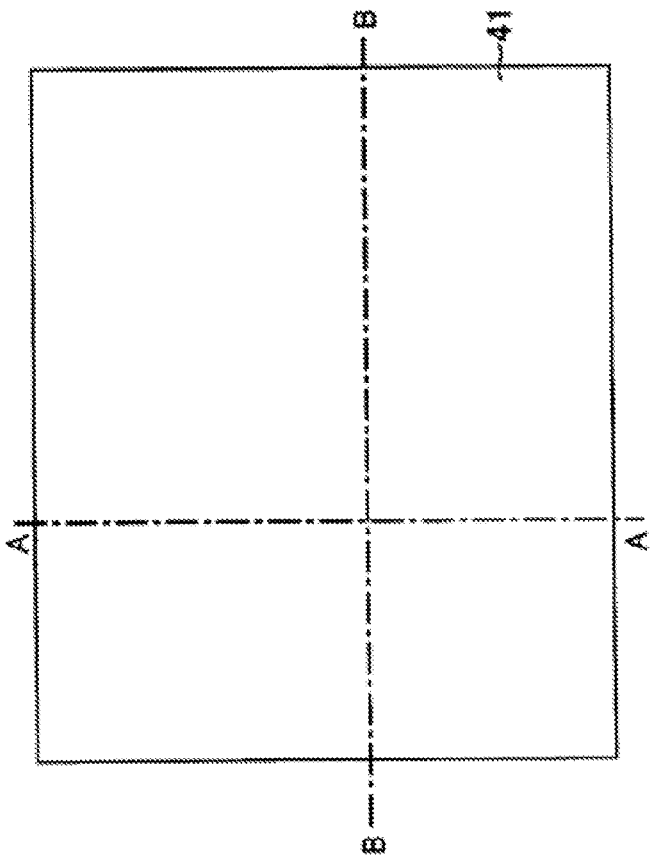
Figure 23B:
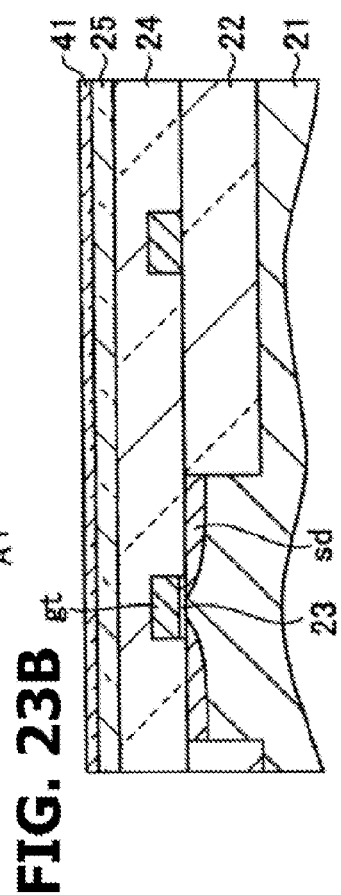

Reference is made to FIG. 23T, FIG. 23A and FIG. 23B. An interlayer insulating film 24 and a hard mask film 25 are formed above a silicon substrate 21, similarly to the step explained by making reference to FIG. 14T, FIG. 14A and FIG. 14B. In Embodiment 3, a hard mask film 25 is called a first hard mask film 25.

In Embodiment 3, a second hard mask film 41 is formed on the first hard mask film 25. The second hard mask film 41 is formed, for example, by depositing silicon oxide to a depth of approximately 20 nm (±10 nm or so). In this regard, another material such as SiN, TEOS, USG, BPSG, SiOC, or a porous low dielectric material can be used as the material for the second hard mask film 41.

It is preferable that the substance or material for the first hard mask film 25 is different from the substance of material for the second hard mask film 41. If there is a difference in the substance or material between the first hard mask and the second hard mask film 41, then differences arise in the etching rate in patterning and the polishing rate in CMP. In the case of CMP to be explained later by making reference to FIG. 29T, FIG. 29A, FIG. 29B, FIG. 30T, FIG. 30A, and FIG. 30B, it is preferable that the first hard mask film 25, which constitutes a backing, is less susceptible to being polished than is the second hard mask film 41, which is an upper film.

Reference is made to FIG. 24T, FIG. 24A and FIG. 24B. A reflection preventing film is formed on the second hard mask film 41. A resist pattern in which openings are formed in a first pattern for forming contact holes, is formed on the reflection preventing film. The shape of the first pattern is, for example, the same as that in Embodiment 2.

By way of the first etching, this resist pattern is used as mask, thereby etching the reflection preventing film, the second hard mask film 41, and the first hard mask film 25 by RIE. As the first stage of the first etching, the reflection preventing film and the second hard mask film 41 are etched in the first place. In the first stage etching, use is made of an etching gas which selectively etches silicon oxide.

As the second stage of the first etching, the first hard mask film 25 is etched by way of further etching operation. In the second stage etching, use is made of an etching gas which selectively etches silicon nitride.

The send hard mask 41 and the first hard mask 25, in both of which openings op1 are formed in the first pattern, are formed by means of the first etching.

Figure 25A:
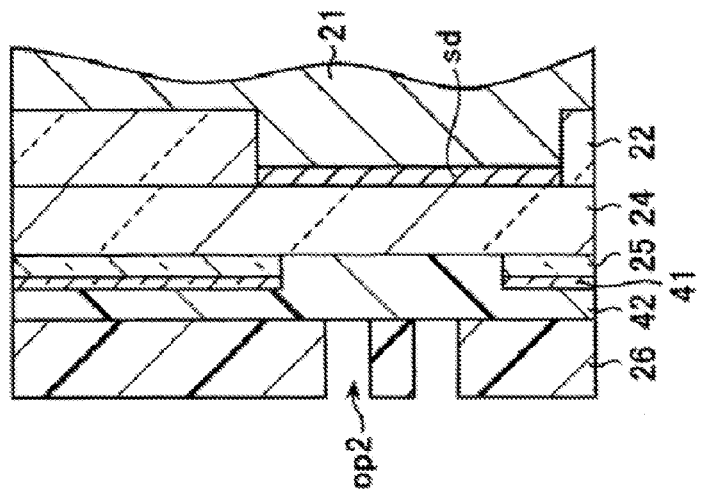
Figure 25T:
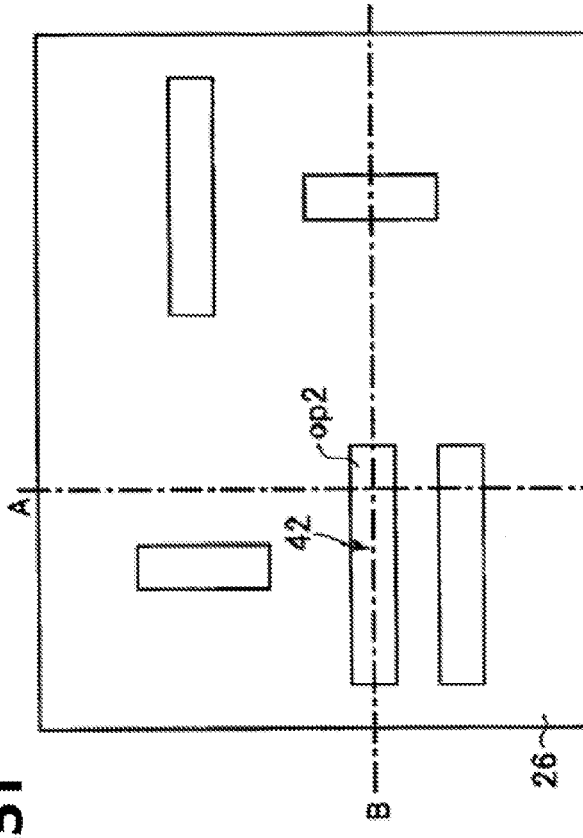
Figure 25B:
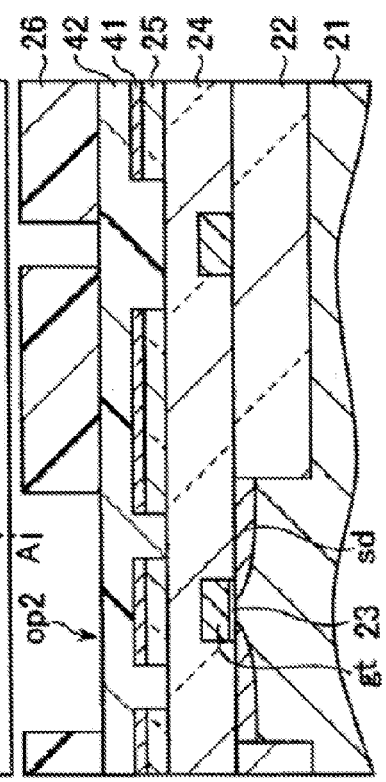

Reference is made to FIG. 25T, FIG. 25A and FIG. 25B. A reflection preventing film 42 is formed on the second hard mask 41. A resist pattern 26 in which openings are formed in a second pattern for forming contact holes, is formed on the reflection preventing film 42 by means of photolithography. The shape of the second pattern is, for example, the same as that in Embodiment 2.

Figure 26A:
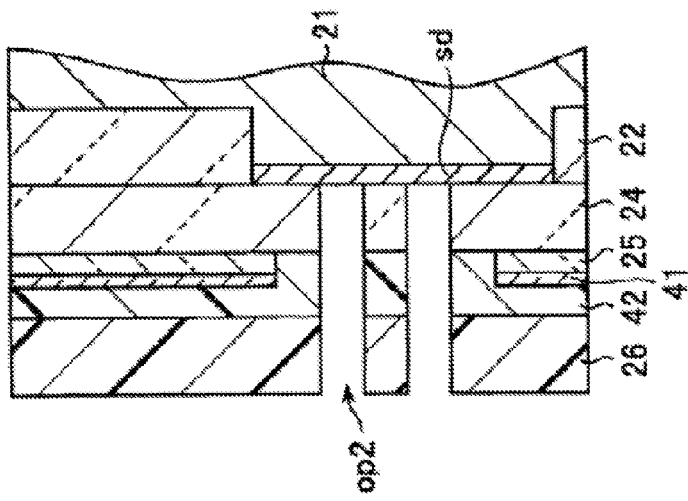
Figure 26T:
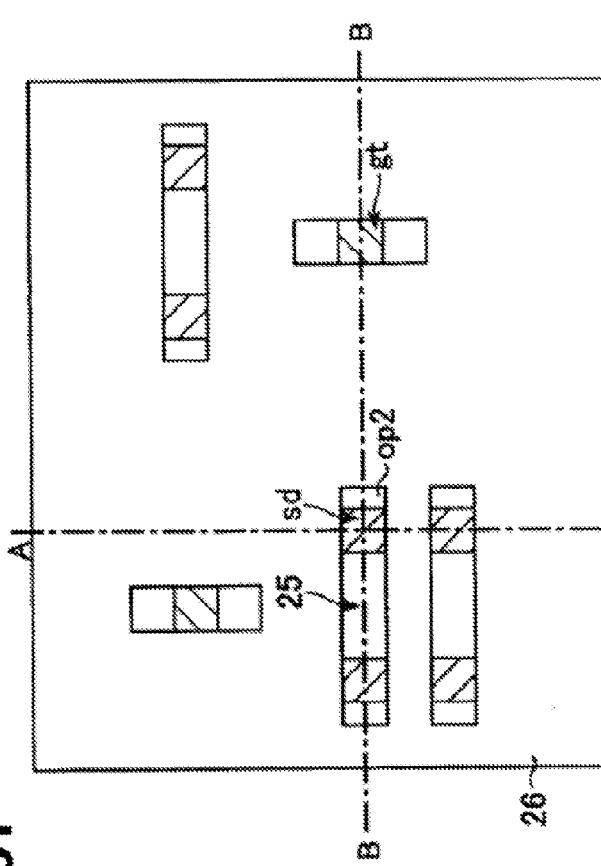
Figure 26B:
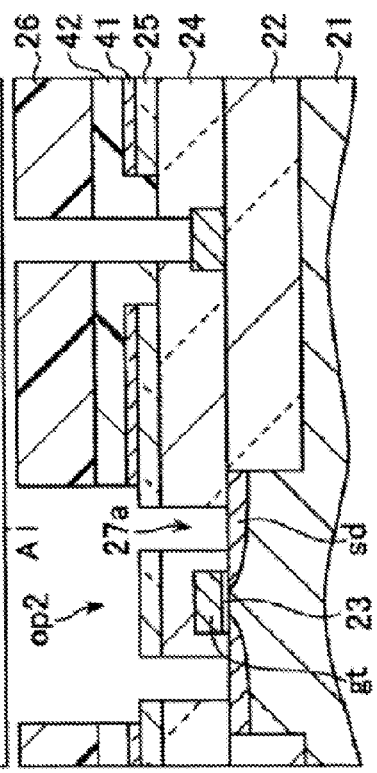

Reference is made to FIG. 26T, FIG. 26A and FIG. 26B. By way of the second etching, the resist pattern 26 is used as mask, thereby etching the reflection preventing film 42 and the interlayer insulating film 24 by RIE. The etching conditions for the second etching are, for example, the same as those for the second etching in Embodiment 2.

In Embodiment 3, the interlayer insulating film 24 and the second hard mask 41 are formed of silicon oxide, for example. That is, the material is the same. Therefore, the interlayer insulating film 24 and the second hard mask 41 are etched simultaneously in the second etching. In regions where the second hard mask 41 is exposed at the bottom of openings in the second pattern, the second hard mask 41 is removed and the first hard mask is exposed. That is, the openings op1 in the first pattern and the openings op2 in the second pattern are formed in the second hard mask 41 as they are after completion of the second etching. The interlayer insulating film 24 is removed at the intersections of the openings op2 in the second pattern and the openings op1 in the first pattern.

Reference is made to FIG. 27T, FIG. 27A and FIG. 27B. The resist pattern 26 and the reflection preventing film 42 are removed by means of ashing treatment and wet cleaning. In this way, contact holes 27 are formed.

Figure 28A:
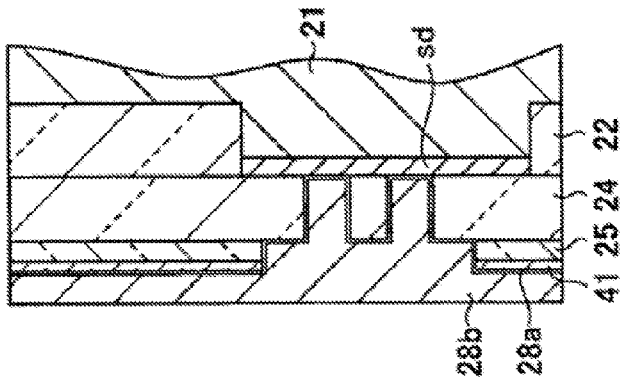
Figure 28T:
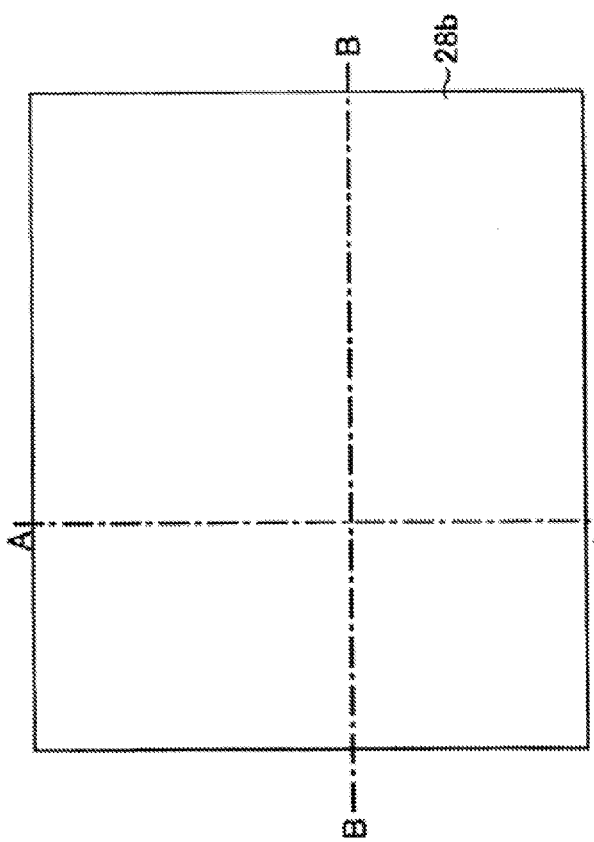
Figure 28B:
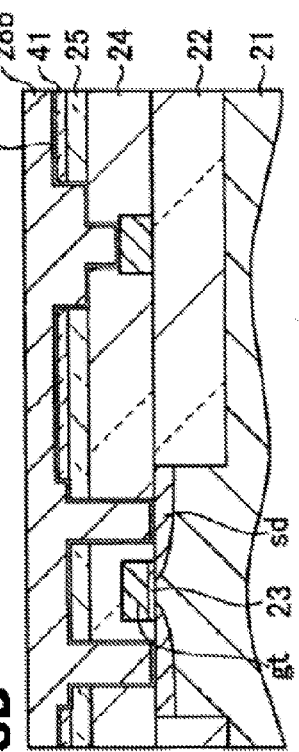

Reference is made to FIG. 28T, FIG. 28A and FIG. 28B. A glue film 28*a* and a conductive film 28*b* are deposited similarly to the step explained for Embodiment 2 by making reference to FIG. 19T, FIG. 19A and FIG. 19B.

Figure 29A:
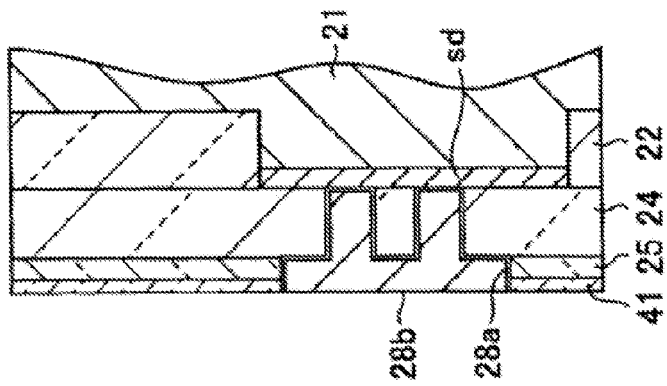
Figure 29T:
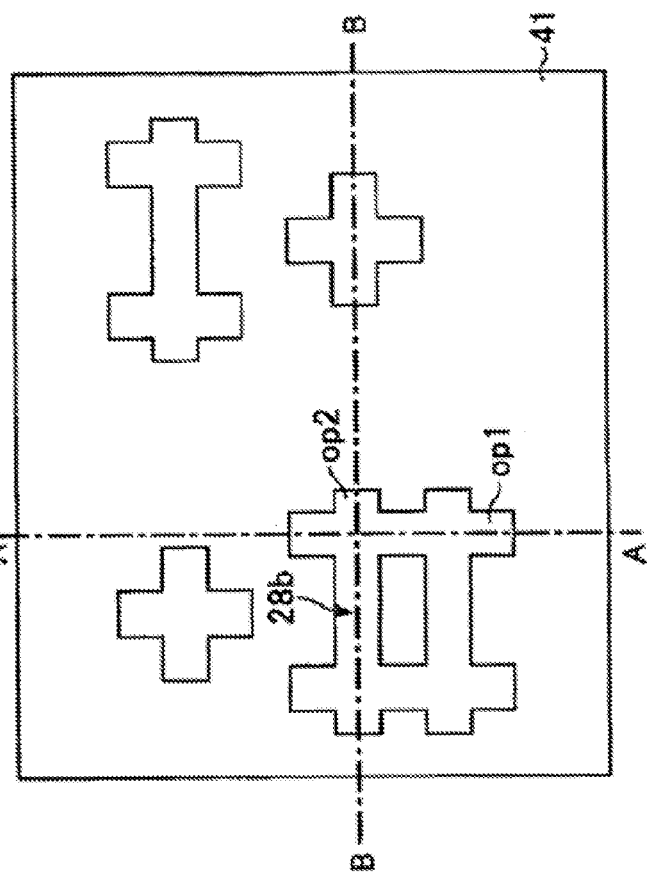
Figure 29B:
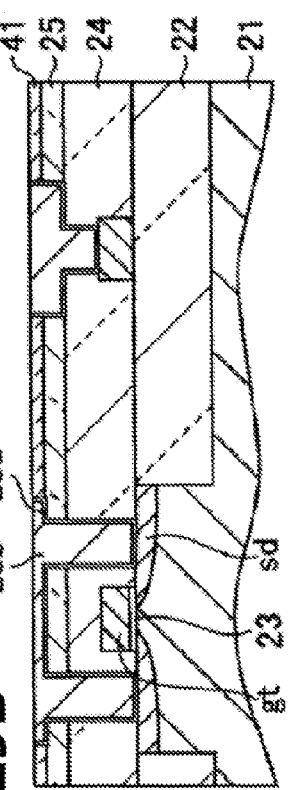

Reference is made to FIG. 29T, FIG. 29A and FIG. 29B. In the first place, as the first stage of CMP, the excess conductive film 28*b* and the excess glue film 28*b* are polished and removed, resulting in the second hard mask 41 being exposed.

Reference is made to FIG. 30T, FIG. 30A and FIG. 30B. In the next place, as the second stage of CMP, the conductive film 28*b* and the glue film 28*a* which are embedded in the openings of the second hard mask 41, are polished and removed, resulting in the first hard mask 25 being exposed. In this way, contact plugs 29 are formed in the contact holes 27.

Furthermore, similarly to the step explained for Embodiment 2 by making reference to FIG. 21T, FIG. 21A and FIG. 21B, first layer wirings 31 are formed in an interlayer insulating film 30, thereby forming multilayer wirings in the upper portion. In this way, the semiconductor device based on Embodiment 3 is formed.

In Embodiment 3, the second hard mask 41, which are located on the first hard mask 25, are added, as compared to Embodiment 2. The excess conductive film 28b and the excess glue film 28a, both of which are to be removed by means of CMP when forming the contact plugs 29, are formed on the upper surfaces of the second hard mask 41.

For the purpose of reliably removing the excess conductive films 28b and the excess glue films 28a, over polishing is performed in which the backing film is also polished to some extent. In the case of Embodiment 2, this backing film is the hard mask 25. Thus the hard mask 25 is subjected to over polishing. In the case of Embodiment 3, this backing film is the second hard mask 41. Thus the second hard mask 41 is subjected to over polishing.

In Embodiment 2 and Embodiment 3, the hard mask 25 is left as the interlayer insulating film 25, in which the flange sections 29b are embedded. In Embodiment 2, the interlayer insulating films 25 are polished in the over polishing. However, unnecessary polishing of the interlayer insulating film 25 is not desirable.

In Embodiment 3, it is possible to restrain the polishing of the interlayer insulating film 25, by so arranging that the second hard mask 41 is laminated on the first hard mask 25, and that the conductive film 28b and the glue film 28a are polished and removed.

As explained above with regard to Embodiment 2 and Embodiment 3, contact plugs which include column sections and flange sections and which are explained regarding the SRAM manufacturing method in Embodiment 1 can be applied to logic circuits as well.

Contact plugs which include column sections and flange sections and which are explained in relation to Embodiment 1 to Embodiment 3 will be summarized.

Figure 31A:
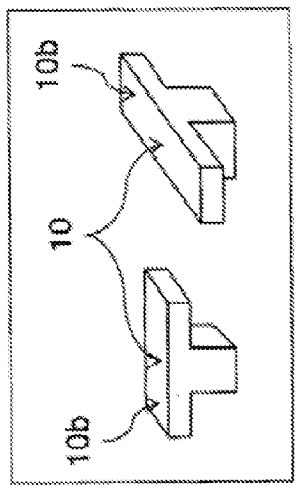
FIG. 31A is a schematic perspective view which illustrates a contact plug and interlayer insulating films in which the contact plug is embedded.

FIG. 31A is a schematic perspective view illustrating a contact plug 10 and interlayer insulating films 4 and 5, the contact plug 10 including a column section 10a and a flange section 10b, the interlayer insulating films 4 and 5 being interlayer insulating films in which the contact plug 10 is embedded.

Figure 31C:
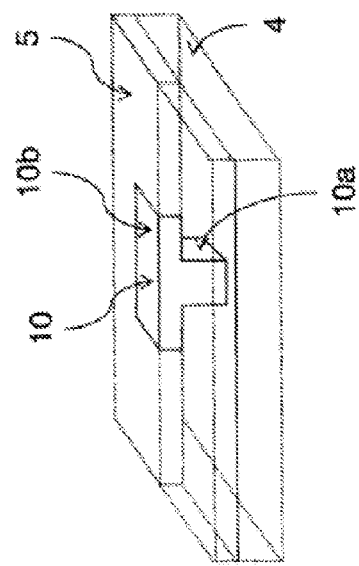
FIG. 31C is a perspective view of a contact plug which includes a plurality of column sections.
Figure 31B:
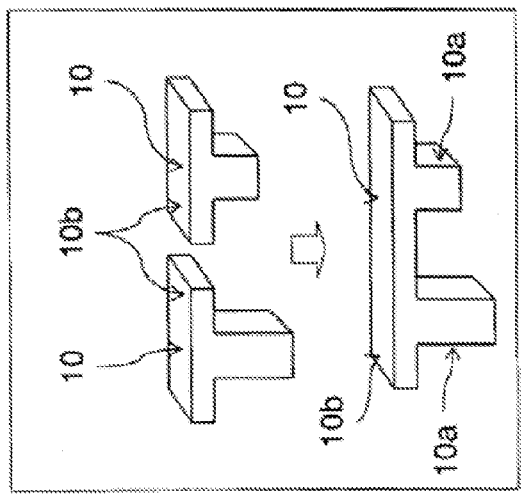
FIG. 31B is a perspective view which illustrates two types of contact plugs in which the extension directions of flange sections are different.

FIG. 31B is a schematic perspective view illustrating two types of contact plugs 10 in which the extension directions of flange sections 10b are different.

As mentioned above, it is possible to integrally form contact plugs including flange sections 10b and column sections 10a by so arranging that metal material are embedded in the openings formed in the interlayer insulating film (hard mask) 5 in the first pattern, and in the recesses formed in the interlayer insulating film 4 at the intersections of the first pattern and the second pattern.

The column sections 10a are in contact with the source/drain regions or the gate electrodes of the transistors located below. The flange sections 10b jut out in one of the in-plane directions from the upper portions of column sections 10a. The openings in the interlayer insulating film 5 in which the flange sections 10b are embedded can be formed by the first etching performed prior to the second etching, the second etching serving to form recesses in the interlayer insulating film 4 in which the column sections 10a are embedded.

Those portions of the contact plugs in the Embodiments which face gate electrodes in in-plane directions, with interlayer insulating film interposed in between, constitute minute column sections 10a. Therefore, the areas of the surfaces facing the electrodes are restricted. Due to the above, it is possible to restrict the parasitic capacitance generated between the contact plugs and the gate electrodes.

The flange sections 10b are formed to be larger than the column sections 10a. Due to the above, connection deficiencies in which the contact plugs are involved and which are caused by mislocations of first layer wirings, are less liable to occur than in a case where no flange sections are present and where contact plugs 10 are formed of column sections 10a only. Furthermore, contact areas between first layer wirings and contact plugs 10 turn out to be larger. Therefore, lower resistance is achieved.

Furthermore, since the flange sections 10b are larger than the column sections 10a, the degree of freedom of arrangement of the first layer wirings is higher than in a case where no flange sections 10b are provided. For example, it is possible to restrict parasitic capacitances between wirings in first layers by so arranging that distances between wirings in first layers are increased, or that facing lengths are decreased.

FIG. 31C is a schematic perspective view of a contact plug 10 which includes a plurality of column sections 10a. It is possible to realize local interconnection such as shared interconnection by combining layouts together in the stage of physical design so that the flanges 10b of adjacent contact plugs 10 overlap each other.

By using such layouts as well as contact plugs including column sections and flange sections, it becomes easy to achieve an arrangement where minute transistors which are for use for SRAMs and logic circuits and which are formed on the surface of a silicon substrate, are deftly connected to wiring layers which are formed in layers above the minute transistors. Furthermore, since the degree of freedom of arrangement of wiring layers disposed on flanges increases, it becomes easy to optimize wiring layouts.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a semiconductor substrate;
   a first transistor, that includes a first source/drain region and a first gate electrode, formed on the semiconductor substrate;
   a second transistor, that includes a second source/drain region and a second gate electrode, formed on the semiconductor substrate;
   an insulating film that covers the first and second source/drain regions and the first and second gate electrodes; and
   a first contact plug formed in the insulating film and connected to the first source/drain region and the second gate electrode,
   wherein:
   the first contact plug includes a first column section, a second column section and a first flange section,
   the first column section extends from the first flange section to the first source/drain region and is in contact with the first source/drain region,
   the second column section extends from the first flange section to the second gate electrode and is in contact with the second gate electrode,
   the first flange section juts out from an upper portion of the first column section and an upper portion of the second column section in a plan view, and an upper surface of the first flange section is planarized, the first column section, the second column section and the flange section include a same material, and the first flange section is connected to the first column section and the second column section.

2. The semiconductor device according to claim 1, wherein the first transistor and the second transistor are load transistors in an SRAM.

3. The semiconductor device according to claim 1, wherein the first column section and the second column section are disposed side by side in a direction intersecting an extending direction of the gate electrode of the second transistor, and the first flange section juts out in a direction intersecting the extending direction of the gate electrode of the second transistor.

4. The semiconductor device according to claim 1, further comprising a third transistor, that includes a third source/drain region and a third gate electrode, formed on the semiconductor substrate; and a second contact plug formed in the insulating film and connected to the third source/drain region or the third gate electrode, wherein:

the insulating film covers the third source/drain region and the third gate electrode, the second contact plug includes a third column section and a second flange section, the third column section extends from the second flange section to the third source/drain region or third gate electrode and is in contact with the third source/drain region or the third gate electrode, and the second flange section juts out from an upper portion of the third column section in a plan view and has a planarized upper surface; and a cross section of the third column section has a same shape of a cross section of the first column shape or a cross section of the second column shape.

5. The semiconductor device according to claim 1, wherein the first flange section juts out either in a direction intersecting the extending direction of the first gate electrode, or in a direction parallel to the extending direction of the first gate electrode.

6. The semiconductor device according to claim 5, wherein with respect to a direction intersecting the direction in which the first flange section juts out, a dimension of the first flange section and a dimension of the first column section are equal to each other.

7. The semiconductor device according to claim 1, wherein:

the insulating film includes a first insulating film and a second insulating film, that includes a material different from a material of the first insulating film, formed on the first insulating film;

the first column section is disposed in the first insulating film;

the first flange section is disposed in the second insulating film; and an upper surface of the second insulating film and an upper surface of the first flange section are flush with each other.

8. The semiconductor device according to claim 1, further comprising a wiring layer formed on the first flange section.

* * * * *